(12) United States Patent
Diana et al.

(10) Patent No.: US 10,895,353 B2
(45) Date of Patent: Jan. 19, 2021

(54) METHOD OF LED LIGHT ENGINE ASSEMBLY

(71) Applicant: Lumileds Holding B.V., Schipol (NL)

(72) Inventors: Frederic Stephane Diana, Santa Clara, CA (US); Seng-Hup Teoh, Morgan Hill, CA (US); Michael Wasilko, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/729,175

(22) Filed: Dec. 27, 2019

(65) Prior Publication Data

US 2020/0340630 A1 Oct. 29, 2020

Related U.S. Application Data

(60) Provisional application No. 62/837,581, filed on Apr. 23, 2019, provisional application No. 62/846,072, filed on May 10, 2019, provisional application No. 62/850,959, filed on May 21, 2019.

(51) Int. Cl.

| | |
|---|---|
| *F21K 9/61* | (2016.01) |
| *H01L 27/15* | (2006.01) |
| *F21V 7/00* | (2006.01) |
| *H05K 1/11* | (2006.01) |
| *F21V 23/00* | (2015.01) |

(52) U.S. Cl.
CPC ............... *F21K 9/61* (2016.08); *F21V 7/0058* (2013.01); *F21V 23/005* (2013.01); *H01L 27/153* (2013.01); *H05K 1/118* (2013.01)

(58) Field of Classification Search
CPC ................................. F21V 7/0058; F21K 9/61
See application file for complete search history.

(56) References Cited

U.S. PATENT DOCUMENTS

| | | | |
|---|---|---|---|
| 7,095,461 B2 | 8/2006 | Kim | |
| RE46,781 E | 4/2018 | Go et al. | |
| 10,585,333 B1* | 3/2020 | Hardy | ........................ F21V 3/02 |
| 2003/0117790 A1 | 6/2003 | Lee et al. | |

(Continued)

FOREIGN PATENT DOCUMENTS

| | | |
|---|---|---|
| CN | 202093200 U | 12/2011 |
| CN | 102494273 A | 6/2012 |

(Continued)

OTHER PUBLICATIONS

"International Application Serial No. PCT/US2020/029341, International Search Report dated Jul. 29, 2020", 6 pgs.

(Continued)

*Primary Examiner* — Evan P Dzierzynski
(74) *Attorney, Agent, or Firm* — Schwegman Lundberg & Woessner, P.A.

(57) ABSTRACT

A lighting engine, system and method of fabrication are described. The system contains a flexible printed circuit (FPC) shaped as a loop. LEDs are mounted on the FPC to emit light toward a center of the loop. A light guide positioned in an interior of the loop receives light emitted by the LEDs through an edge of the light guide. The light guide has slots formed therein that receive locator pins to limit thermal displacement of the light guide towards the LEDs. Other apparatuses, systems, and methods are also disclosed.

26 Claims, 28 Drawing Sheets

(56) References Cited

U.S. PATENT DOCUMENTS

| | | |
|---|---|---|
| 2007/0086213 A1 | 4/2007 | Hsieh |
| 2007/0091639 A1 | 4/2007 | Yoo |
| 2008/0170415 A1 | 7/2008 | Han et al. |
| 2008/0239754 A1 | 10/2008 | Kang et al. |
| 2009/0040415 A1 | 2/2009 | Kim |
| 2009/0273732 A1* | 11/2009 | Shimura ............... G02B 6/0016 349/65 |
| 2010/0027255 A1 | 2/2010 | Chang et al. |
| 2010/0165253 A1 | 7/2010 | Jung et al. |
| 2010/0290248 A1 | 11/2010 | Park |
| 2011/0134359 A1 | 6/2011 | An et al. |
| 2011/0157517 A1* | 6/2011 | Mouri ............... G02F 1/133608 349/62 |
| 2011/0164199 A1 | 7/2011 | Han et al. |
| 2011/0292317 A1 | 12/2011 | Kim et al. |
| 2012/0106198 A1 | 5/2012 | Lin et al. |
| 2012/0236593 A1 | 9/2012 | Wei et al. |
| 2012/0281432 A1 | 11/2012 | Parker et al. |
| 2012/0320621 A1 | 12/2012 | Kleo et al. |
| 2013/0044513 A1 | 2/2013 | Pan |
| 2013/0169886 A1 | 7/2013 | Kuromizu |
| 2013/0235297 A1 | 9/2013 | Yu et al. |
| 2013/0265784 A1 | 10/2013 | Nieberle |
| 2013/0279194 A1 | 10/2013 | Hodrinsky et al. |
| 2013/0336008 A1 | 12/2013 | Kim et al. |
| 2013/0343087 A1 | 12/2013 | Huang |
| 2014/0133174 A1 | 5/2014 | Franklin et al. |
| 2014/0320747 A1 | 10/2014 | Kamada |
| 2014/0340875 A1 | 11/2014 | Hayashi |
| 2014/0362603 A1* | 12/2014 | Song ....................... H01L 33/60 362/612 |
| 2014/0375897 A1 | 12/2014 | Sugiura |
| 2015/0003110 A1 | 1/2015 | Choi et al. |
| 2016/0161665 A1 | 6/2016 | Chen et al. |
| 2016/0231501 A1 | 8/2016 | Horiguchi |
| 2016/0313490 A1 | 10/2016 | Steijner et al. |
| 2017/0031080 A1 | 2/2017 | Speer et al. |
| 2017/0176663 A1 | 6/2017 | Furuta et al. |
| 2018/0024290 A1 | 1/2018 | Watanabe et al. |
| 2018/0039137 A1 | 2/2018 | Yamakawa |
| 2018/0045878 A1 | 2/2018 | Murata et al. |
| 2018/0073688 A1 | 3/2018 | Xu et al. |
| 2018/0074253 A1 | 3/2018 | Ji et al. |
| 2018/0128434 A1 | 5/2018 | Moon et al. |
| 2018/0246378 A1* | 8/2018 | Lee ................... G02F 1/133608 |

FOREIGN PATENT DOCUMENTS

| | | |
|---|---|---|
| CN | 103292216 A | 9/2013 |
| CN | 203431782 U | 2/2014 |
| CN | 105627190 A | 6/2016 |
| EP | 1780584 | 5/2007 |
| EP | 2202457 A2 | 6/2010 |
| JP | 2012014834 | 1/2012 |
| KR | 20110027329 | 3/2011 |
| KR | 101081807 | 11/2011 |
| WO | WO-2015135240 A1 | 9/2015 |

OTHER PUBLICATIONS

"International Application Serial No. PCT/US2020/029341, Written Opinion dated Jul. 29, 2020", 7 pgs.

"International Application Serial No. PCT US2020 029353, Invitation to Pay Additional Fees dated Jul. 28, 2020", 12 pgs.

"U.S. Appl. No. 16/729,162, Non Final Office Action dated Aug. 20, 2020", 28 pgs.

"International Application Serial No. PCT/US2020/029329, International Search Report dated Sep. 4, 2020", 6 pgs.

"International Application Serial No. PCT/US2020/029329, Written Opinion dated Sep. 4, 2020", 13 pgs.

"International Application Serial No. PCT/US2020/029362, Invitation to Pay Additional Fees dated Aug. 31, 2020", 17 pgs.

"U.S. Appl. No. 16/729,151, Non-Final Office Action dated Oct. 13, 2020", 6 pgs.

"International Application Serial No. PCT/US2020/029353, International Search Report dated Sep. 18, 2020", 8 pgs.

"International Application Serial No. PCT/US2020/029353, Written Opinion dated Sep. 18, 2020", 10 pgs.

"U.S. Appl. No. 16/729,162, Response filed Nov. 19, 2020 to Non-Final Office Action dated Aug. 20, 2020", 11 pgs.

"International Application Serial No. PCT/US2020/029362, International Search Report dated Oct. 21, 2020", 8 pgs.

"International Application Serial No. PCT/US2020/029362, Written Opinion dated Oct. 21, 2020", 15 pgs.

\* cited by examiner

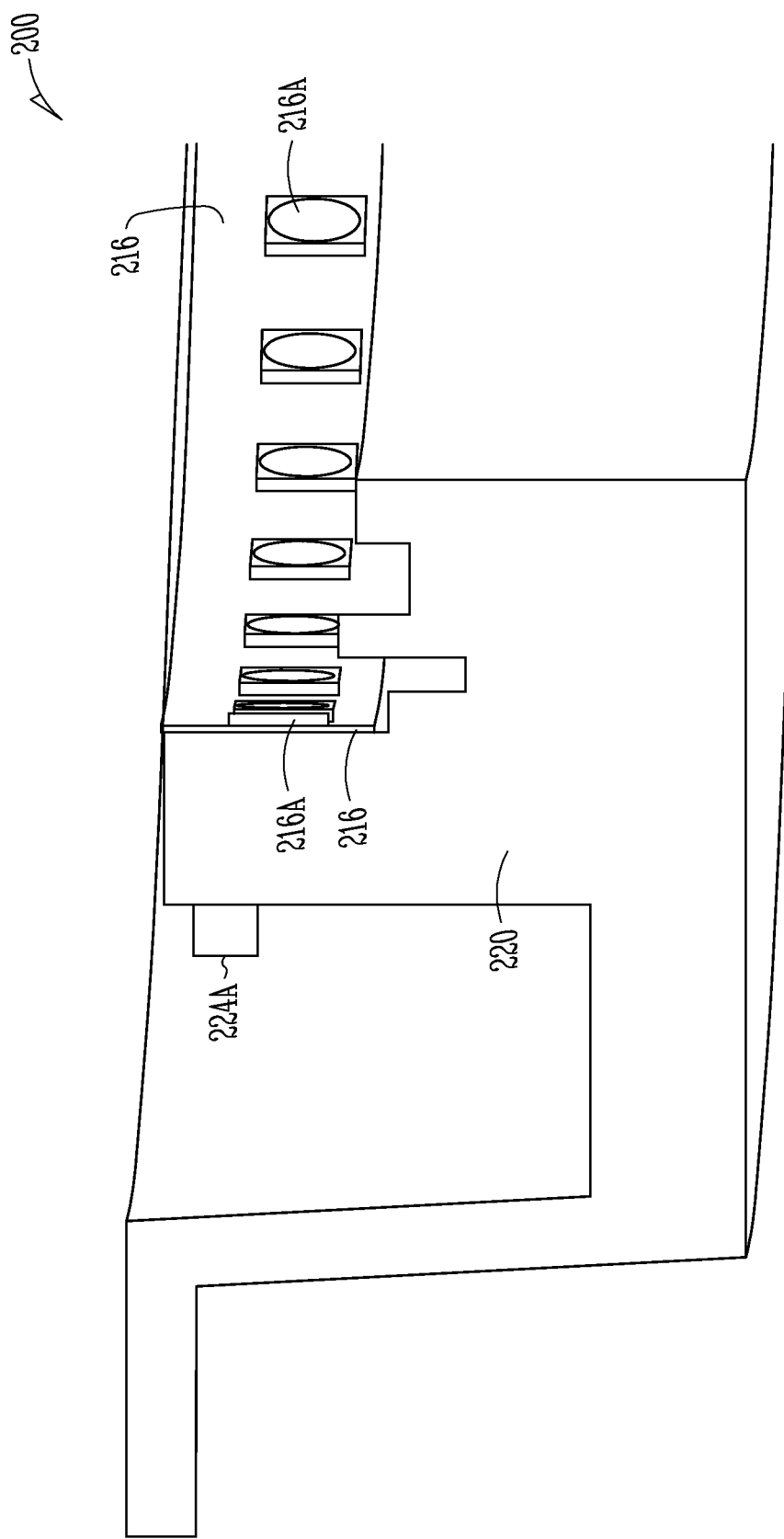

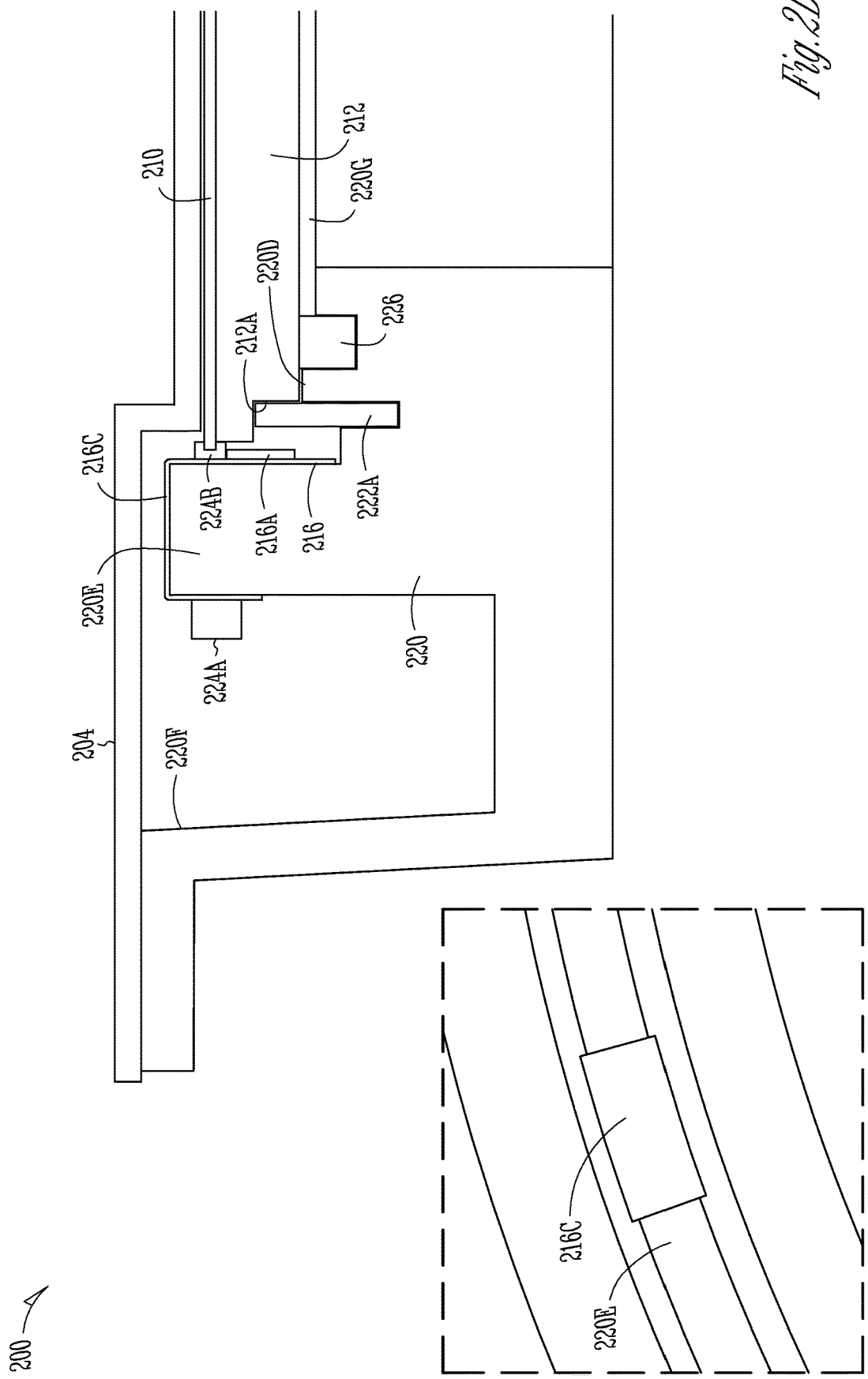

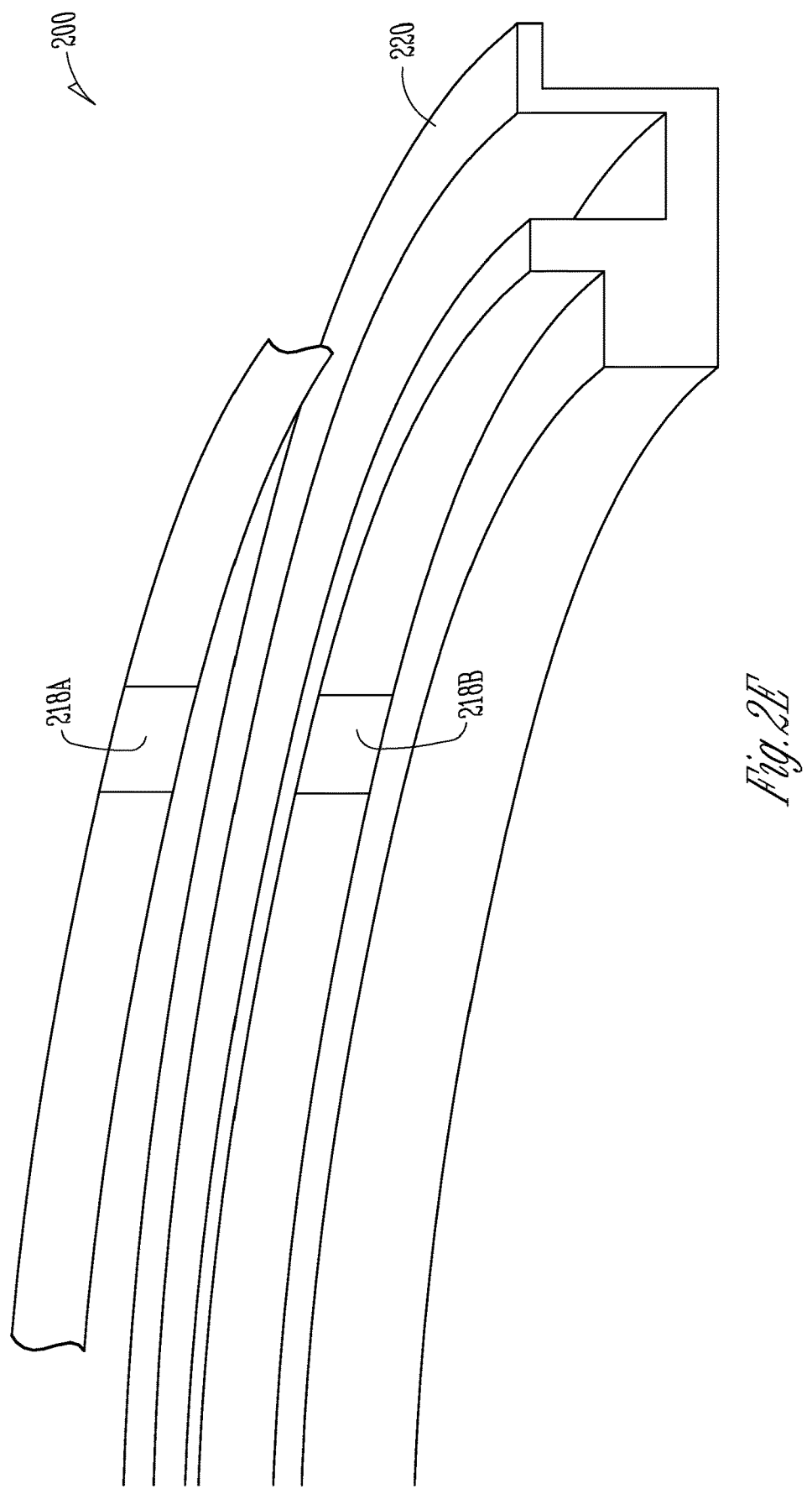

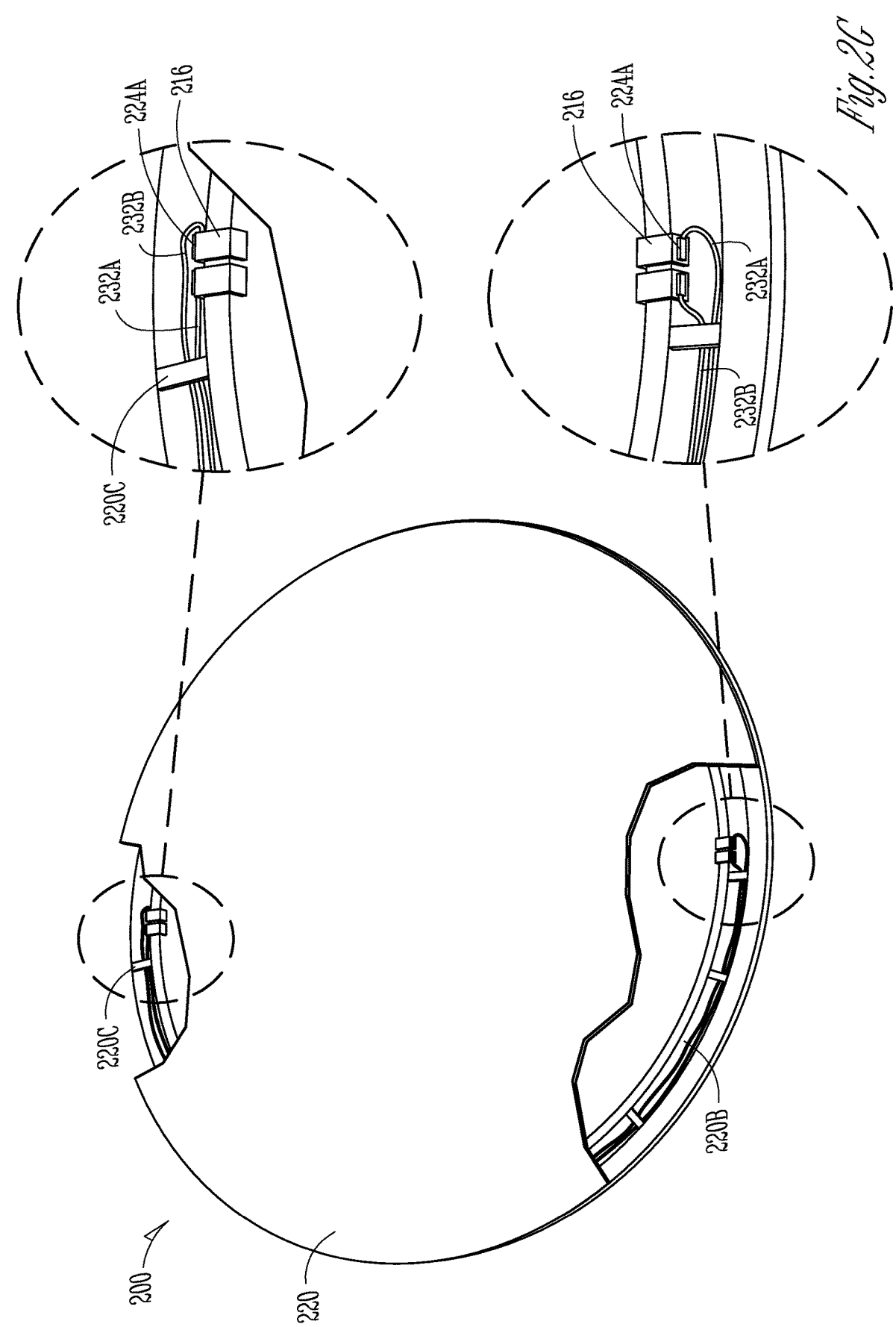

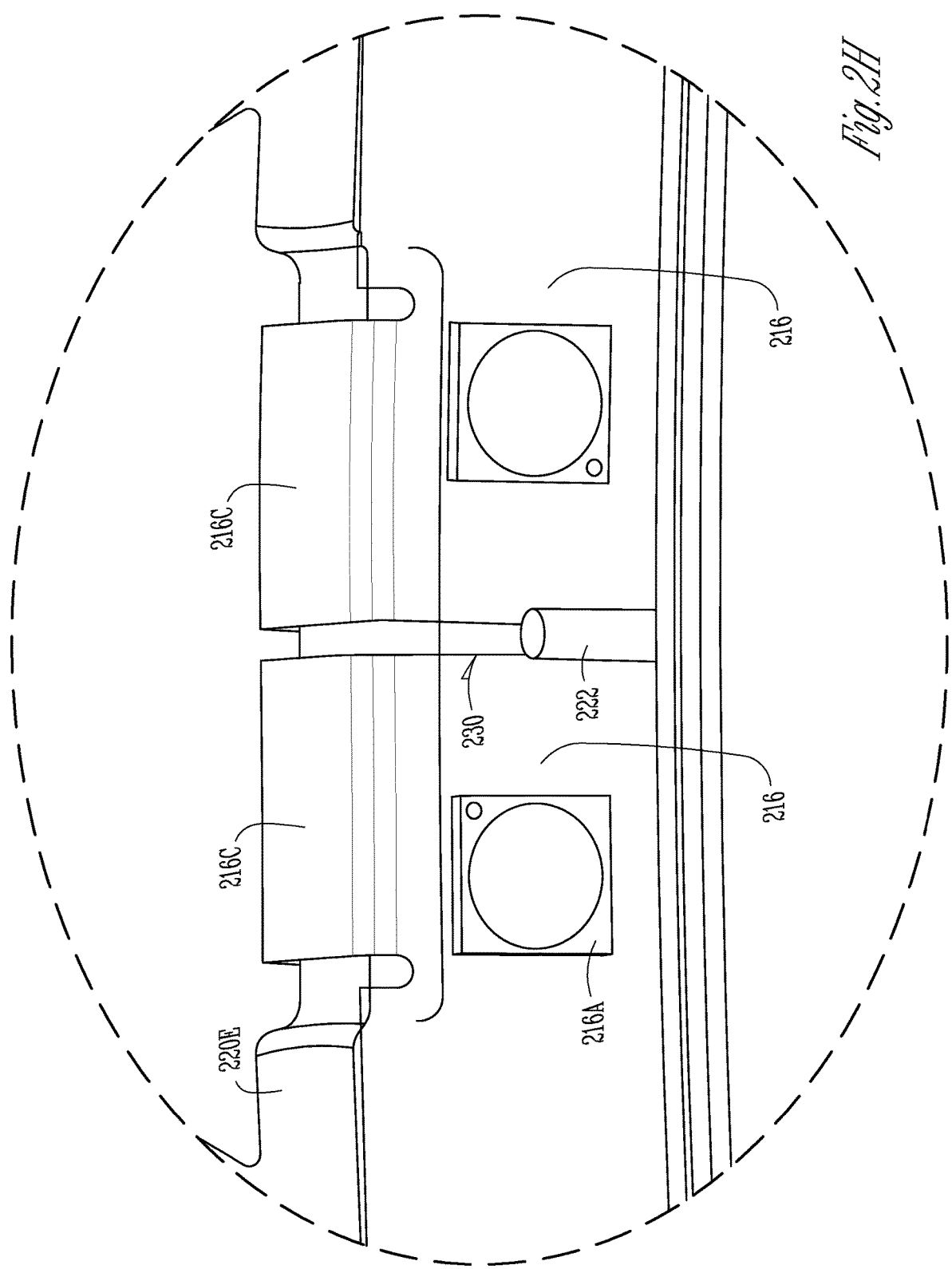

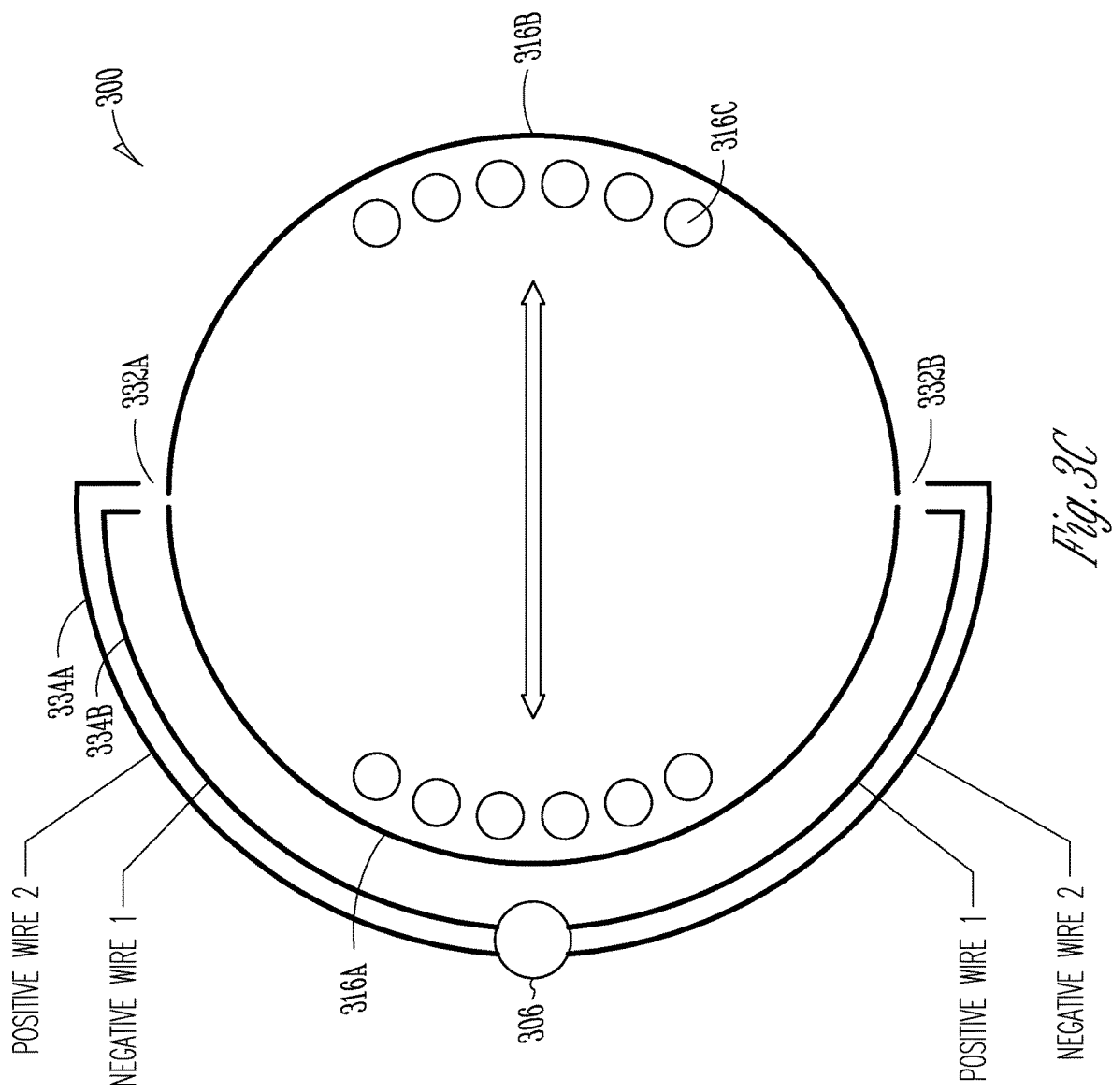

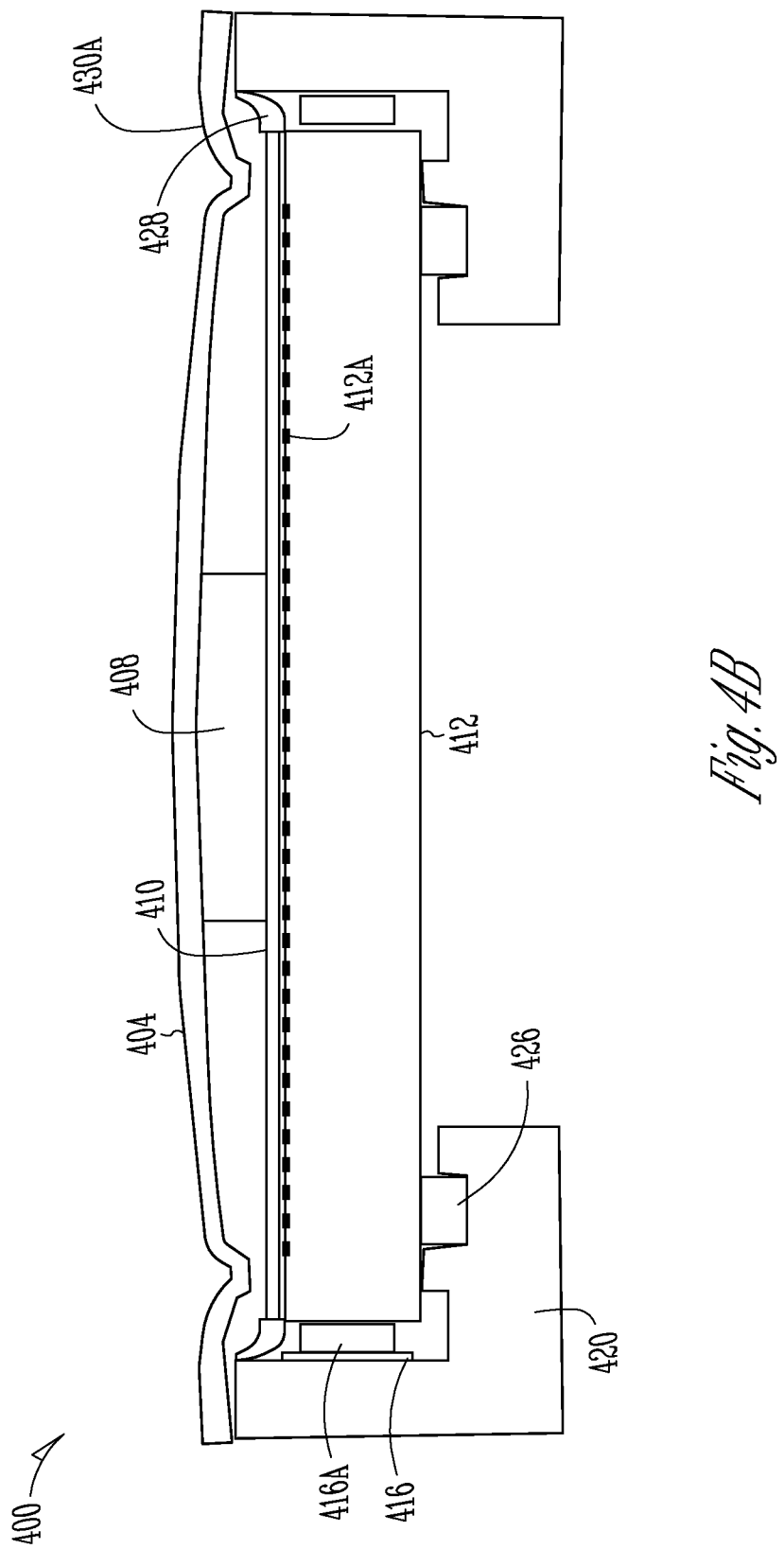

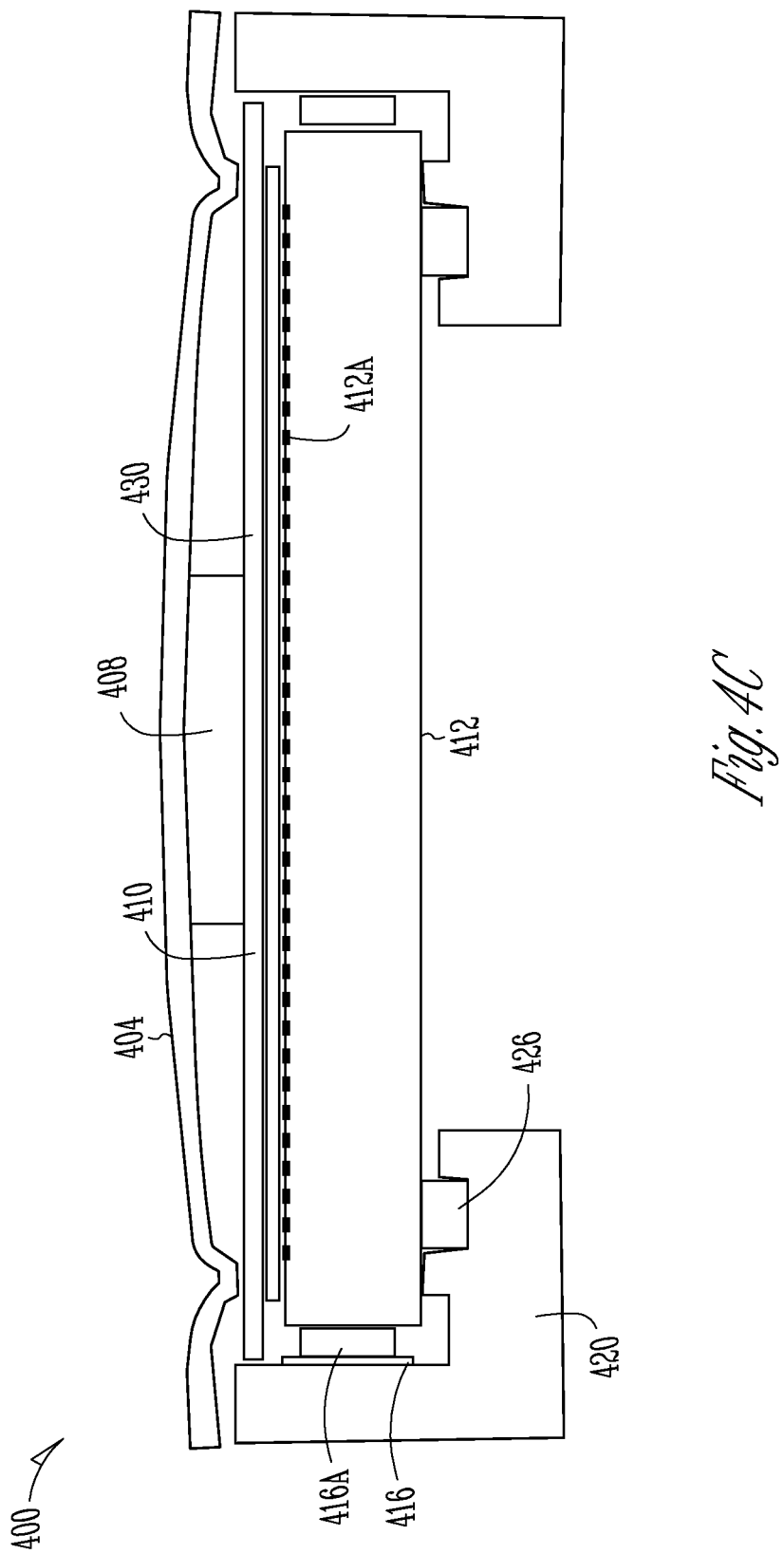

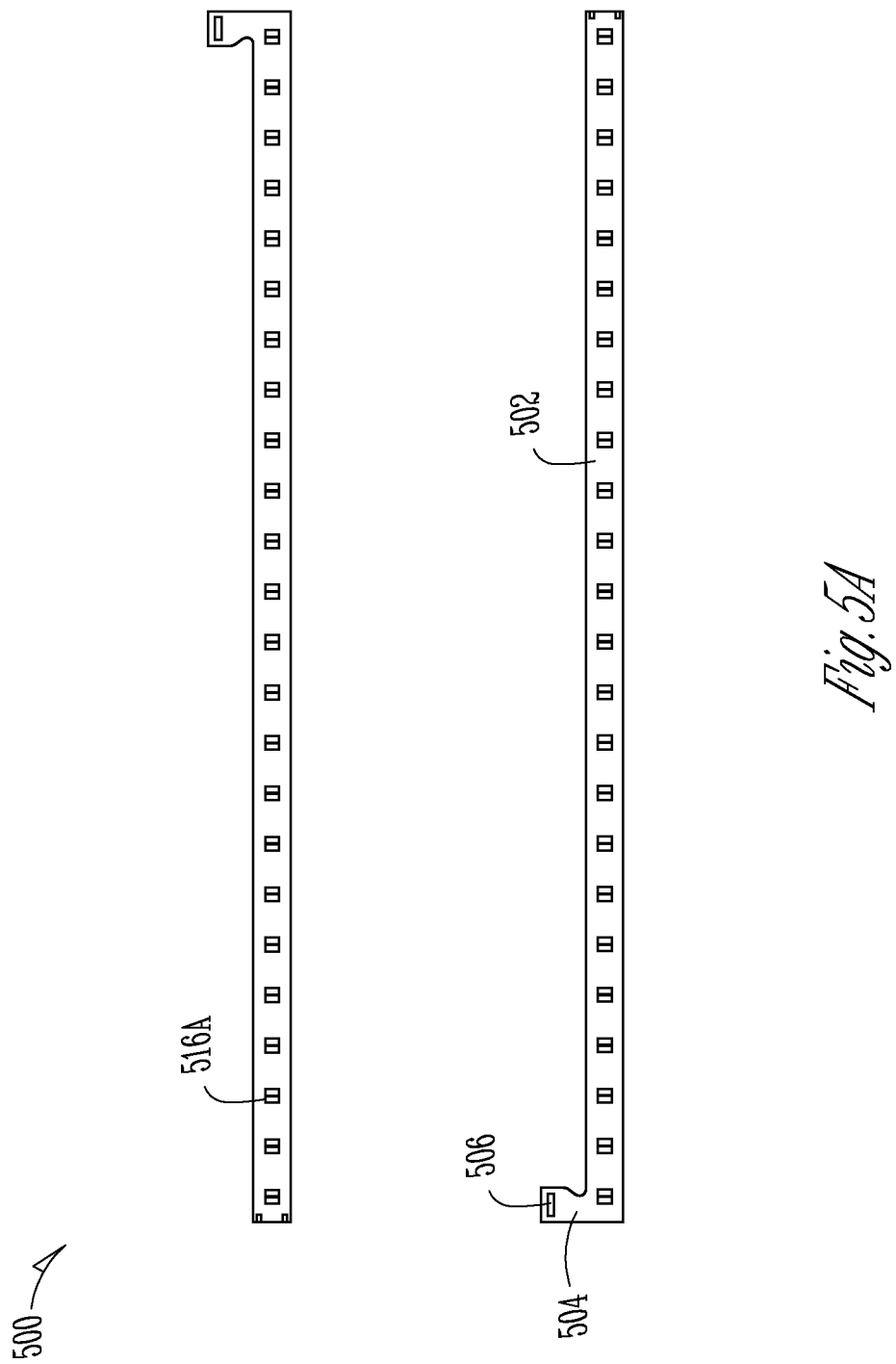

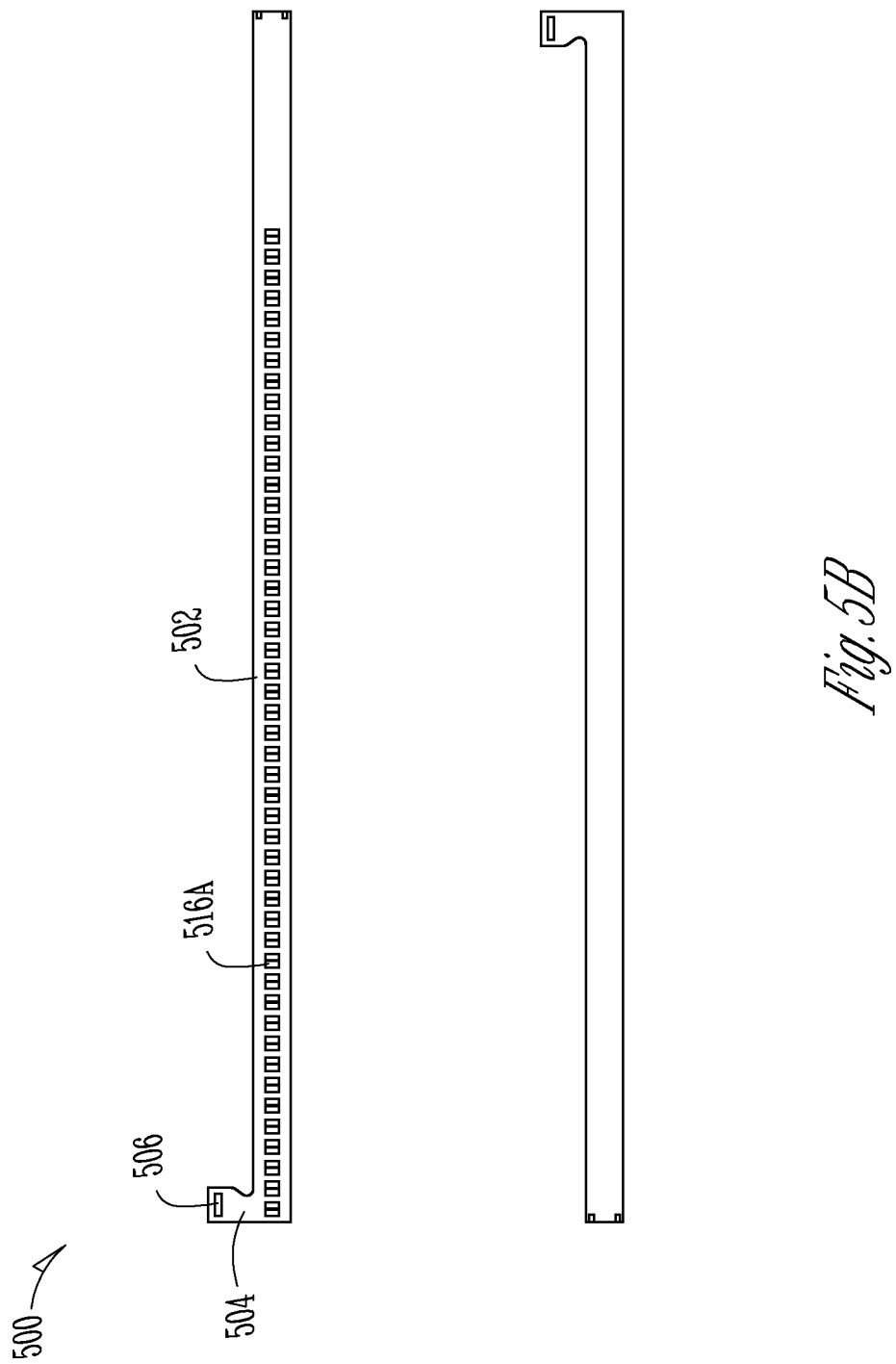

METHOD OF LED LIGHT ENGINE ASSEMBLY

PRIORITY

This application claims the benefit of priority to U.S. Provisional Patent Application Ser. No. 62/837,581, filed Apr. 23, 2019, U.S. Provisional Patent Application Ser. No. 62/846,072, filed May 10, 2019, and U.S. Provisional Patent Application Ser. No. 62/850,959, filed May 21, 2019, each of which is incorporated herein by reference in its entirety.

CROSS REFERENCE TO RELATED APPLICATIONS

This application is related to commonly assigned U.S. patent application Ser. No. 16/729,131, entitled "Flexible Printed Wiring Structure for LED Light Engine," U.S. patent application Ser. No. 16/729,151, entitled "Alignment Features for LED Light Engine," and U.S. patent application Ser. No. 16/729,162, entitled "LED Light Engine Features," all filed on Dec. 27, 2019.

TECHNICAL FIELD

The present disclosure relates to a light emitting diode light engine.

BACKGROUND

Lighting applications can use light emitting diodes (LEDs) as their light sources. Many LED installations use Class 2 circuitry. Class 2 circuitry provides protection from electrical shock and carries no risk from fire. For example, in the US Class 2 compliant power supplies convert a 120V (wall) power into low voltage 12V or 24V using DC drivers that use less that 60V (in dry applications, 30V in wet applications), less than 5 amps, and under 100 W. These considerations may pose restrictions on the number of LEDs a Class 2 driver can operate simultaneously. In a number of lighting systems, however, it may be desirable to increase the number of LEDs used and/or power used by the LEDs, and thus supplied by the power supply, beyond that of Class 2. Thus, additional care may be taken in designing circuitry and installations for non-class 2 lighting systems that are not class 2 compliant.

BRIEF DESCRIPTION OF THE DRAWINGS

FIG. 2A shows a cross-sectional view of a portion of a portion of a light engine, in accordance with some embodiments.

FIG. 2D shows another cross-sectional, three-dimensional view of a portion of a light engine, in accordance with some embodiments.

FIG. 2E shows another exploded view of cross-sectional view of a portion of a light engine, in accordance with some embodiments.

FIG. 2G shows a sectioned view of various portions of the light engine, in accordance with some embodiments.

FIG. 2H shows a perspective view of a portion of a light engine, in accordance with some embodiments.

FIG. 3C shows another example of a symmetric design, in accordance with some embodiments.

FIG. 4B shows another simplified geometric model of a light engine, in accordance with some embodiments.

FIG. 4C shows another simplified geometric model of a light engine, in accordance with some embodiments.

FIG. 5A shows an example of an FPC in accordance with some embodiments.

FIG. 5B shows another example of an FPC in accordance with some embodiments.

Figure 1:
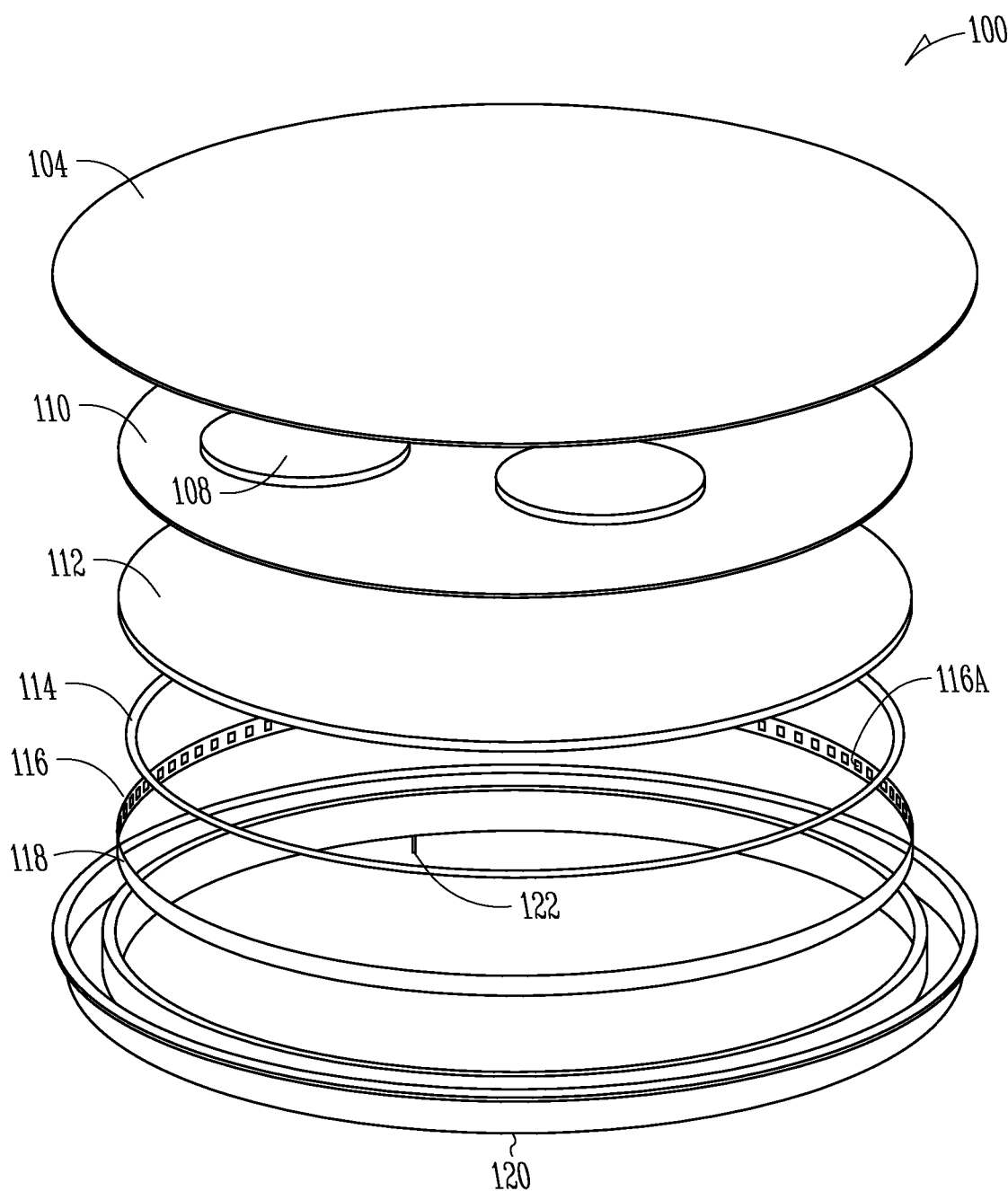
FIG. 1 shows an exploded view of an example of a light engine, in accordance with some embodiments.

Corresponding reference characters indicate corresponding parts throughout the several views. Elements in the drawings are not necessarily drawn to scale. The configurations shown in the drawings are merely examples and should not be construed as limiting the scope of the disclosed subject matter in any manner.

DETAILED DESCRIPTION

Non-Class 2 lighting systems are discussed in detail below. The lighting systems may be suitable for indoor or outdoor applications. Such lighting systems may use LEDs and light-guide technologies to provide lighting because of reduced glare and pleasing appearance when the lighting system is in both an on state, in which one or more of the LEDs of the system provide illumination, and an off state, in which none of the LEDs provide illumination. For example, as described in more detail below, outdoor applications of the LED systems (such as pedestrian path lights) can use fairly expansive batwing-shaped light distributions (e.g., see FIG. 5) in a vertical plane, while indoor applications (such as flat-screen displays and luminaires) can use more Lambertian (e.g., a diffusely reflecting surface, where an apparent brightness of the surface to an observer is substantially the same regardless of the observer's angle-of-view) light distributions. LEDs with light-guide optics can be used with both indoor and outdoor applications.

As described above, Class 2 lighting systems can be relatively straightforward to design and manufacture due to the relatively low power. However, for relative high-power and/or high voltage (non-Class 2) lighting systems, additional safety-related factors may prove more challenging to meet in a design. Specifically, meeting standards known as, for example, UL8750 approbations standard (in North America) or EN 61347-2-13 and EN61347-1 (in Europe) can create challenges when designing and manufacturing a high-power LED light engine for a non-Class 2 system.

FIG. 1 shows an exploded view of an example of a light engine, in accordance with some embodiments. The light engine 100 can be used for a variety of different applications, such as indoor and/or outdoor lighting, signage, signals, emergency vehicle lighting, luminaires, pedestrian lights, pole lights, and other applications. The light engine 100 may be a non-class 2 device in which a flame-retardant barrier is not used due to the dimensions and materials selected for the elements used therein.

The light engine 100 contains a number of elements connected together with connectors, such as screws or other mechanical fasteners known in the art, or, for example, chemical fasteners such as adhesives. The light engine 100 provides light from LEDs 116a mounted on a flexible printed circuit (FPC) 116 (also referred to as a flexible printed circuit board). In some embodiments, the FPC 116 may be shaped as a circular loop (although other shapes may be used), with the LEDs 116a facing inward toward the center of the loop in some embodiments or outward away from the center of the loop in other embodiments.

The LEDs 116a can thus be mounted or otherwise mechanically supported or adhered by the FPC 116 (e.g., via a direct support requirement (DSR)) as well as being electrically powered by the FPC 116 and positioned to emit light inwards toward a center of the circular loop. The LEDs 116a can be soldered or otherwise electrically coupled onto the FPC 116. Drivers for the LEDs 116a can also be positioned on, or otherwise connected to, the FPC 116. The LEDs 116a, the accompanying circuitry (of the FPC 116 and elsewhere), and mechanical/optical elements can be designed to function at a maximum operating temperature (MOT) of 90° C., 105° C., or any suitable value, as desired dependent on the application and environment in which the light engine 100 is to be used.

The LEDs 116a can be arranged in a line along the FPC 116 (e.g., each LED 116a centered along the same line) or can be arranged in a two-dimensional pattern, such as an array. In some examples, the LEDs 116a can be arranged symmetrically around the FPC 116, with equal spacing around the loop (adjacent LEDs 116a having substantially the same distance therebetween). Such symmetry in some cases may be used to produce a generally uniform output beam. In other examples, the LEDs 116a can be arranged asymmetrically around the flexible printed circuit. One example of asymmetric arrangement may include the LEDs 116a positioned only on one half of the loop, with the other half lacking LEDs 116a (such as being arranged in a semicircle or in any number of segments whose total angular distribution is about 180°). In other examples, the LEDs may cover angular distributions other than about 180° (in any number of segments). Such asymmetry can produce beam shaping, which may be used in applications in which beam-shaping is desirable.

A generally planar, light guide plate (LGP) 112 can be positioned in an interior of the circular loop. The LGP 112 may be formed as a substantially circular disc as shown, or in a multi-sided shape (e.g., octagon) in other embodiments. The shape may be dependent, for example, on the light arrangement desired from light engine 100, in addition to or instead of the LED placement. The LGP 112 may receive light emitted by the LEDs 116a through a circumferential edge of the LGP 112. The LGP 112 can be shaped as a generally planar disc having a circular edge. In some examples, the LGP 112 can have a thickness of about 6 mm and a diameter of about 383 mm (approximately 19 inches). Note that here, as with all other measurements, the measurements are provided at about room temperature (e.g., about 20° C.-25° C.) and have a tolerance associated therewith. In some examples, the LGP 112 can be formed from poly(methyl methacrylate) (PMMA), glass or any other substantially transparent material. When the LGP 112 is formed from PMMA with a thickness of 6 mm can allow the LGP 112 to pass a UL94 V0 requirement, which limits flammability of plastic materials. The UL94 V0 requirement requires burning to stop within ten seconds on a vertical specimen, with drops of particles being allowed as long as they are not inflamed. By forming the LGP 112 from PMMA with a thickness of 6 mm, the maximum operating temperature of the LGP 112 may be greater than 90° C. In some examples, the LEDs 116a can be spaced greater than or equal to 1.6 mm from an edge of the LGP 112. The LGP 112 may have a dispersive pattern (e.g., dots, see FIG. 11) on one or more surfaces, such as a lower surface through which light exits to illuminate objects thereunder or an upper surface.

The LGP 112 may rest on a gasket 114 disposed within a chassis 120. The gasket 114 may be supported by the chassis 120 to allow the edge of the LGP 112 to be centered over the LEDs 116a. The gasket 114 may be a frontside gasket that, like a backplate gasket provided in a groove of the backplate 104, can help protect the light engine 100 from water and dust ingress. The gasket 114 in some embodiments may be formed from silicone, such as white silicone. The chassis 120 may be formed from a metal, such as aluminum. A thermocouple (TC) point 118 may be used to measure the temperature of the chassis 120. The TC point 118 may be located, for example, on top of the connector at the LED side.

A reflector 110 may be positioned directly adjacent to the LGP 112. The reflector 110 may in some embodiments be shaped similar to the LGP 112. In other embodiments, the reflector 110 may be formed independent of the shape of the LGP 112. As above, the reflector 110 may be formed as a substantially circular disc. The reflector 110 may be positioned adjacent to the upper surface of the LGP 112 to reflect light from the LGP 112 back toward the LGP 112.

The reflector 110 can be formed from a metal or other reflective material. In some examples, the reflector 110 can be formed from aluminum, and reflect substantially all light—e.g., having a reflectivity greater than or equal to 94% over all or a portion of the visible spectrum (e.g., having a wavelength between 300 nm and 700 nm). The reflector 110 can be attached with electrical tape or another adhesive. The electrical tape can be positioned on one or more portions of the top and bottom surfaces of the reflector 110. In some examples, tape on the top and/or bottom surface may extend radially outward past the circumferential edge of the reflector 110 and may be stuck to each other via adhesive on the tape. In some examples, the adhered tape portion may be bent approximately orthogonally to a plane of the top/bottom surface of the reflector 110, which may be bent away from the LEDs 116a.

The reflector 110 may have a first side facing the LGP 112 and a second side facing away from the LGP 112. The reflector 110 in some embodiments may be separated from a backplate 104 by one or more gap fillers 108. The gap fillers 108 may be formed from foam or another material and may have any desired shape, such as a circular disc shape or a semicircular shape (with the flat portion facing inwards). The gap filler 108 can have a thickness and durability selected to reduce or eliminate a gap between the reflector 110 and the LGP 112. Reducing or eliminating the gap can reduce or eliminate shadowing caused by the gap fillers 108. In other embodiments, the reflector 110 may only be separated along edges of the reflector 110, instead contacting the reflector backplate 104 over a substantial portion of the diameter of the reflector 110 and eliminating the gap filler 108.

The backplate 104 may be formed from a metal. The backplate 104 may be, in some embodiments, about 1.53 mm. The backplate 104 may be positioned adjacent to the reflector 110 on a side opposite the LGP 112. The backplate 104 may be connected to the chassis 120 by one or more fasteners. A cable reliever may be disposed on the backplate 104 to provide support for one or more cables used to hang or otherwise retain the light engine 100. The stress reliever can prevent tearing the electrical cables off main connection points.

A set of locator pins 122 (also called light guide alignment pins) may have matching slots in optics (not shown in FIG. 1) below the chassis 120 of the light engine 100, which can help meet a specified minimum distance requirement between the LEDs 116a and their live traces and the input surface of the optics. In some examples, the specified minimum distance can be 0.8 mm. The locator pins 122 can space apart two or more of the optical or mechanical elements. For example, the locator pins 122 can be used to account for thermal expansion (in conjunction with slots in the LGP 112, as described in more detail below), so that elements of the light guide engine 100 are able to expand and contract without breaking or causing unwanted displacement of any such element. A creepage and clearance distance in the FPC 116 can be greater than or equal to about 1.6 mm. This clearance distance can be the edges of the outer electrical traces to the edges of the FPC 116.

A maximum opening without the LGP 112 may be minimized or reduced to prevent electrical accessibility and therefore bypass any requirement for low-temperature impact tests to the LGP 112. The size of the light engine 100, a metal choice of the chassis 120 and/or backplate 104 and other metal components, and a spacing of the LEDs 116a may be designed to maximize or increase thermal dissipation and pass, for example, a UL8750 thermal test at a maximum power output. Flats in the chassis 120 can be designed to prevent any issue of air gaps below the LEDs 116a.

The FPC 116 may be designed such that male electrical connectors and wires that supply power to the LEDs 116a are located outside the optical path, which can improve the light-emission surface uniformity and increase the optical quality. The FPC 116 can optionally allow for curved shapes.

FIGS. 2A-2G show various views (e.g., cross-sectional/top) of a portion of a light engine and components thereof, in accordance with some embodiments. The various components are sized and positioned as shown and described to permit automatic adjustment for differences between materials with different coefficient of thermal expansions (CTEs) as the temperature of the light engine changes, as well as alignment for continued proper orientation of the light from the light engine. In addition, the size and spacing of the components in the light engine are designed to reduce or minimize the presence of air gaps below the LEDs shown, as well as preventing ingress of contaminants such as dust and water into the light engine.

Figure 2B:
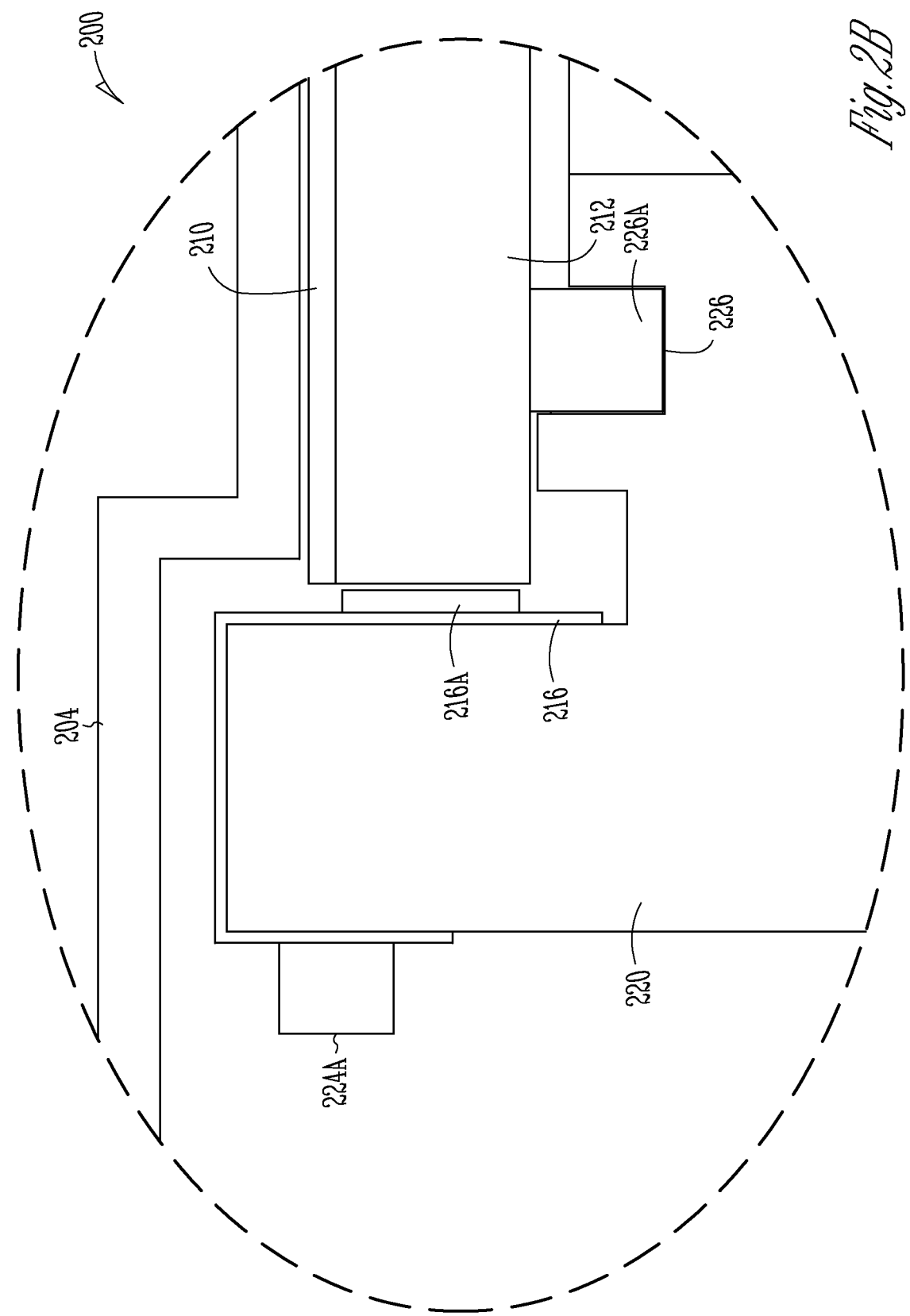
FIG. 2B shows an exploded view of a cross-sectional view of a portion of a light engine, in accordance with some embodiments.
Figure 2C:
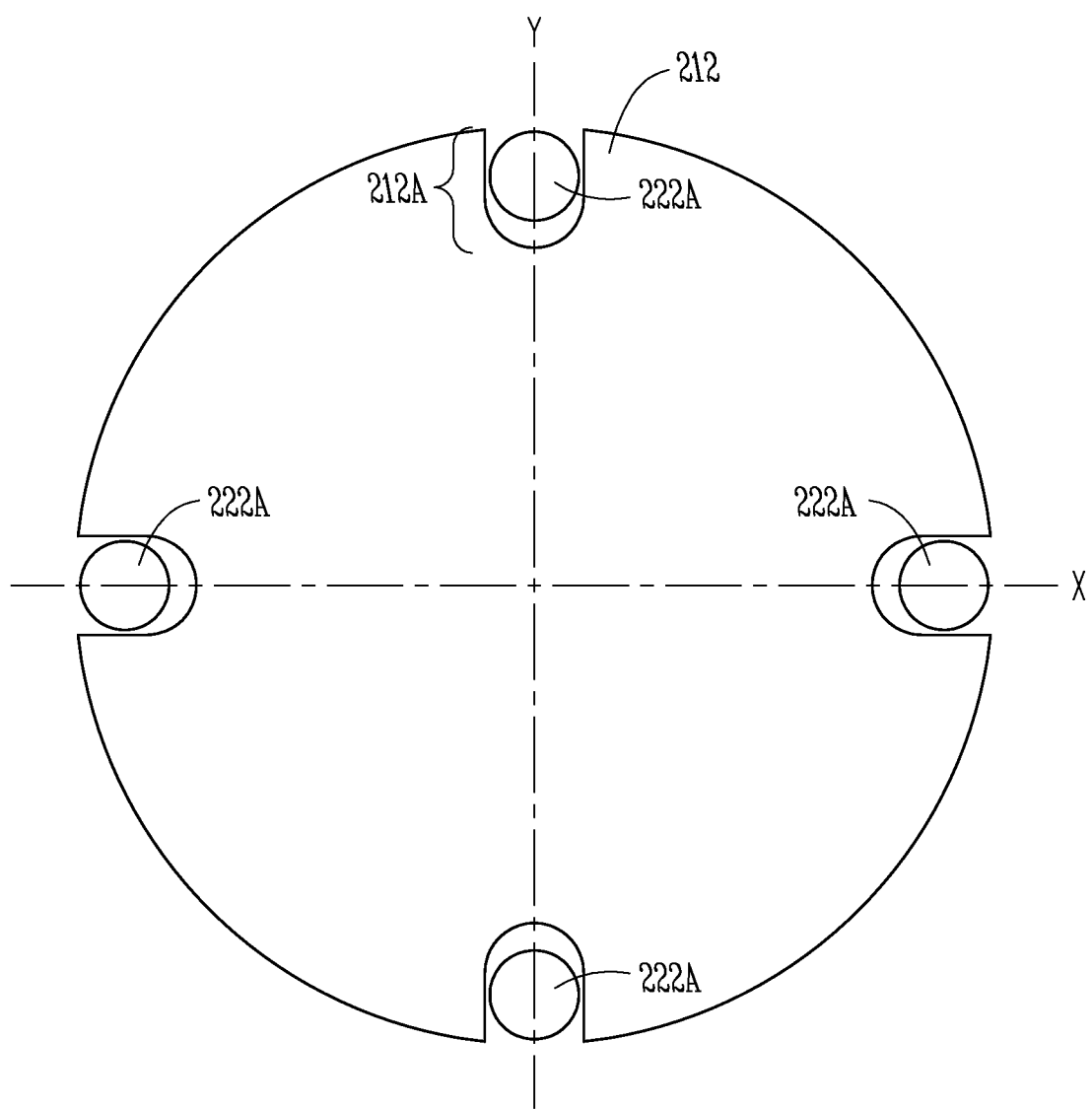
FIG. 2C shows a light guide plate, in accordance with some embodiments.

While only a partial cross-section of the light engine 200 is shown in FIG. 2A, many of the physical features shown in FIG. 1, such as the presence of a backplate, reflector, etc. may be provided, only some of which are shown in FIGS. 2B and 2C. As shown, the light engine 200 may contain multiple FPC 216, with each FPC 216 containing multiple LEDs 216a. The FPC 216 may be coincident with the bottom of the chassis 220.

Similar to the arrangement of FIG. 1, the FPC 216 in FIG. 2A may be retained in a frame or chassis 220 in a semicircular shape in a manner similar to that of FIG. 1. The chassis 220 may have an inner cavity in which the optical components are disposed and an outer cavity in which wiring is disposed. The FPC 216 may, for example, be about 11.5 mm in height and 381 mm in length. A connector 224a (FIG. 2B) within the chassis 220 may make electrical contact to the FPC 216 and provide power, ground, and/or signals to the FPC 216 and LEDs 216a through one or more extensions 216c of the FPC 216 (also called fingers of the FPC 216). Bending the extension 216c over the sidewall of the cavity in the chassis 220 eliminates shadows being formed by the power and control circuitry within the light engine 200. The FPC 216 may be disposed on the circular inner wall of the inner cavity of the chassis 220. The FPC 216 may be retained on the wall by insulating tape, for example, or may be soldered to a bridge that connects an inner and outer cavity, as described in more detail below. In some embodiments, each FPC 216 may extend around about half of the diameter of the inner wall, the light engine 200 containing two FPCs 216. In other embodiments, each FPC 216 may extend around one third or one quarter, for example, of the diameter of the inner wall. In some embodiments, the connector 224a may make electrical contact with the FPC 216 and inward facing LEDs 216a. Placement of the LEDs 216a along each FPC 216 may be similar to that described in relation to FIG. 1.

In some embodiments, optics such as the LGP 212 may be disposed between at least a portion of the chassis 220 and the FPC 216. As shown, a reflector 210 may be disposed above the FPC 216 and LEDs 216a and an LGP 212 may be disposed between the inward facing LEDs 216a. The LGP 212 may be centered around an opening in the bottom surface of the chassis 220 through which light from the LEDs 216a are emitted. In some embodiments, the LGP 212 may be larger than the opening in the bottom surface of the chassis 220, such that an edge of the LGP 212 interacts with other components, such as the gasket 226 and locator pins 222. In some embodiments, the opening in the chassis 220 may have sidewalls that are substantially perpendicular to the surface of the chassis 220 that faces the LGP 212 throughout the opening. In other embodiments, only a proximate portion of the sidewalls adjacent to the surface that faces the LGP 212 may be substantially perpendicular to the surface that faces the LGP 212, while the remaining portion (more distal from the surface that faces the LGP 212 than the proximate portion) may have a chamfered edge. The chamfered edge may be formed at an acute angle of about 35 degrees, for example.

A backplate 204 may be attached to the chassis 220 via multiple fasteners, such as screws. The screws may be disposed symmetrically around the backplate 204. For example, eight screws (and thus screw holes) may be disposed along the circumference of the backplate 204, having about a 35° angle therebetween. The backplate 204 may not be completely flat; as above, in some embodiments, the backplate 204 may have a recess formed in a center area over the reflector 210 or may have grooves formed over the reflector 210. In some embodiments, an intermediate portion of the backplate 204 may be bent at an about a 90 degree angle between the portion of the backplate 204 disposed over the outer cavity and the portion disposed over the reflector 210. The intermediate portion of the backplate 204 may be disposed over, or proximate to (e.g., within several mm of) an edge of the reflector 210. In other embodiments, the intermediate (bent) portion may be formed at an acute angle of about 35 degrees, extending over about the same range proximate to the edge of the reflector 210. Locator pins 222 may be used to retain the LGP 212 in the chassis 220.

A gasket 226 may be used, as in FIG. 1, to prevent the ingress of air and/or moisture into the light engine 200. The gasket 226 may be essentially flat or have multiple ridges extending from a base portion. In some embodiments, the height of the gasket 226 may be about 5.08 mm, the width of the gasket 226 between the ridges is about 3.86 mm and across the base portion 226a is about 3.96 mm, and the height of the ridges is about 2.54 mm. The gasket 226 may have a diameter of about 373.9 mm (for outer edge distance) or about 364.9 mm (for center-to-center distance). The locator pins 222a may be seated in a machined hole in the chassis 220 such that the locator pins 222a do not contact the LGP 212 when the gasket 226 is fully compressed.

In some embodiments, the distance from the FPC 216 on the chassis 220 to the LGP 212 may be about 1.5 mm, the distance between the top of the backplate 204 and the bottom of the chassis 220 may be about 32.2 mm, the width of an inner cavity of the chassis 220 in which the FPC 216 and LEDs 216a are retained may be about 11.5 mm, a thickness of the backplate may be about 1.59 mm, a distance between the top of the LEDs 216a to the reflector 210 may be about 0.51 mm, the distance between the reflector 210 and the middle of the LEDs 216a may be about 2.44 mm, the distance between the middle of the LEDs 216a and the bottom of the LGP 212 may be about 3.56 mm, the distance between the FPC 216 on the inner wall of the chassis 220 and the reflector may be about 0.71 mm, the distance between the bottom of the LGP 212 and the bottom of the chassis 220 may be about 20.3 mm, and the distance between the bottom of the cavity in the chassis 220, the length of the locator pin 222 may be about 9.53 mm and the locator pin 222 may be about 3.84 mm. Electrical tape may be attached to, and extend from an edge of, the reflector 210. The electrical tape may, in some embodiments, extend from the edge of the reflector 210 around the entire circumference of the reflector 210. The electrical tape in some embodiments may be, an electrically-insulating polyimide tape that meets flame retardant requirements of UL510, Product Category OANZ2) that has a width of greater than about 1.6 mm. The electrical tape may have a thickness of about 0.06 mm and extend from the edge of the reflector 210 radially in either direction (i.e., both inward and outward from the edge) by a distance of greater than about 1.6 mm, such as about 1.75 mm. The length of radial extension from the edge of the reflector 210 may be the same in both directions or may be different (e.g., less inward than outward). The use of the electrical tape may help to prevent generation of Moiré patterns due to the separation between the reflector 210 and the LGP 212, as described in more detail below.

FIG. 2C shows a light guide plate, in accordance with some embodiments. The LGP 212 may have slots 212a that are openings formed therein that are used for retaining the locator pins 222a, 222b, which maintain the LGP 212 in place. In some embodiments, such as that shown in FIG. 2E, insulating tape 218a may cover solder joints (not shown) on the "L" portion of the FPC 216 that couples the FPC 216 with the chassis 220 behind the locator pins 222a, 222b. The insulating tape may be clear or white tape, rather than yellow to provide enhanced reflectivity, for example. In some embodiments, use of the tape may be avoided if reflectivity strips are used. In some embodiments, insulating tape 218b may also be disposed between the FPC 216 and the chassis 220 in the area where the LED strips have been joined with solder. However, the use of insulating tape below the LEDs 216a may be avoided.

In some embodiments, the radial width of the locator pin slots 212a may be as large as possible to allow assembly tolerance and prevent the LGP 212 from contacting the locator pins 222a, 222b upon an increase in temperature due to operation of the light engine 200 and/or external environmental changes. Similarly, in some embodiments, the transverse width of the locator pin slots 212a may be relatively tight to avoid movement in the transverse direction. The upper and lower locator pins 222a may control the x position of the LGP 212, the right and left locator pins 222b may control the y position of the LGP 212, and each of the locator pins 222a, 222b may control rotation of the LGP 212. The pin slots 212a may have a radial width of about 2.5 mm, the diameter of each of the locator pins 222a, 222b may be about 1.588 mm, the width of the pin slots 212a may be about 1.66 mm, and the distance between the end of the pin slots 212a and the end of the straight portion of the pin slots 212a may be about 1.67 mm. This permits the locator pins 222a, 222b to limit thermal displacement (expansion) of the LGP 212 towards the LEDs 216a while minimizing the distance between the LGP 212 and the LEDs 216a. The distance between the LGP 212 and the LEDs 216a may be minimized to 1.5 mm under the worst case ambient heat conditions of about 30° C. due to the different materials used (in some embodiments, the LGP 212 being formed from PMMA while the chassis 220 being formed from aluminum having a CTE 3 times that of PMMA).

Compression forces may be provided by the grooves 204a in the backplate 204 and chassis-supporting forces may be provided by a protrusion 220d in the chassis 220 are not aligned or balanced. The grooves 204a assert downward pressure proximate to a circumference of the reflector 210. This may result in torque around an edge of the LGP 212 that tends to deform the LGP 212 downwards at the center but will also induce deformations into the thin reflector. Assuming the chassis 220 is flat and rigid, a fixed boundary condition is thus present at the contact surface area between the chassis 220 and the LGP 212 (surface area 2, where the chassis-supporting forces 2 are located). The chassis 220 may thus eliminated from consideration. The backplate 204 is in contact with the reflector at the surface area 1 only (where the compression forces 1 are located). The compression force per screw is tuned as to provide the expected deformation of the backplate 204 after screwing is completed. This deformation corresponds to the amount of interference present by design between the backplate 204 and reflector/LGP 212 (about 1.53 mm). The result is about 123 N (approximately 27.6 lbf) with a maximum torque of about 7.3 N-m (approximately 65 in-lb) per screw. The nominal torque is about 13.6 N-m (approximately 120 in-lb) for the hole threading.

To simplify and limit computational time in modeling this design, it is also assumed that there is no gasket 226. The gasket 226, if desired, may be included in a second round of modeling. Contacts between components are set to be bonded, which may not be completely valid, but these contacts are minimized; "non-penetration" contacts which should be the more appropriate interface conditions do not converge. Further, when the backplate is not present, the LGP 212 sits higher than the bottom edge of the LEDs 216*a* so at least a portion of the LEDs 216*a* is visible. This, however, is expected with the gasket 226 on and no backplate pressing down on the LGP 212. Accordingly, the force used to press down the gasket 226 may be relatively high.

FIG. 2D shows another cross-sectional, three-dimensional view of a portion of a light engine, in accordance with some embodiments. FIG. 2D shows one of the locator pins 222*a*, 222*b*, which may have a 1.6 mm diameter. The LGP 212 may have a notch disposed therein for placement of the locator pins 222*a*, 222*b*. The chassis 220 may further contain a ridge 220*e* separating an outer cavity 220*f* of the chassis 220 from an inner cavity 220*g* of the chassis 220. One or more outer AVX connectors 224*a* are disposed in the outer cavity 220*f* (which may also contain other electronics). Similarly, a spacer 224*b* may be disposed in the inner cavity 220*g*, which contains the LGP 212 and FPC 216 among others. In other embodiments, the reflector 210 may mechanically interlock with an L-shaped spacer (rather than the C-shaped spacer shown) that is disposed on the FPC 216 on the ridge 220*e* separating the outer cavity 220*f* and the inner cavity 220*g* of the chassis 220.

The distance between the wall facing the locator pins 222*a*, 222*b* and a portion of the locator pins 222*a*, 222*b* most distal from the wall may be about 3.96 mm. The distance from the corner of the portion of the chassis 220 that retains the locator pins 222*a*, 222*b*. The length of the LEDs 216*a* in the direction from the bottom of the cavity adjacent to the LGP 212 to the top of the cavity may be about 5.18 mm. The distance between the bottom of the LEDs 216*a* and the bottom of the inner cavity 220*g* adjacent to the spacer 220*b* may be about 2 mm.

As indicated above, the backplate 204 may have a center disc and an outer ring circumscribing the center disc. The center disc and outer ring may be connected by an intermediate portion that extends at up to a right angle (e.g., about 30 degrees, about 35 degrees, about 60 degrees or about 90 degrees) from both the center disc and outer ring, although the angles of extension may be the same or may be different. The center disc may contact the reflector 210 and may avoid the use of the gap fillers 208.

Figure 2F:
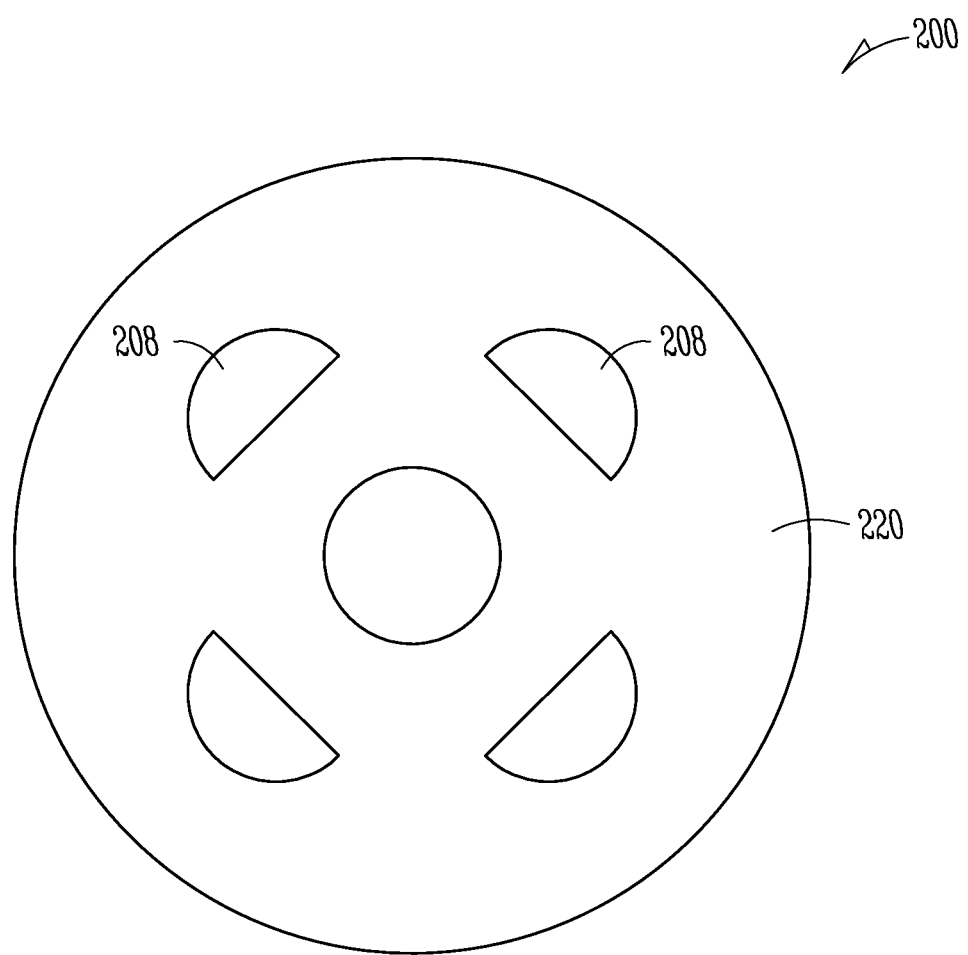
FIG. 2F shows a planar view of a portion of the light engine, in accordance with some embodiments.

In other embodiments, as shown in the planar view of FIG. 2F, gap fillers 208 may separate the reflector 210 from the backplate 204. As shown, the gap fillers 208 may be attached to the backplate 204 via, for example, double-faced sticky pressure-sensitive adhesive (PSA) tape. In other embodiments, the gap fillers 208 may be attached to the reflector 210 instead of, or in addition to, the backplate 204. The gap fillers 208 may be formed from foam such as EPDM/neoprene/styrene-butadiene rubber (SBR) or another material with UL recognition and a MOT greater than about 90 C°. The gap fillers 208 may, as above, have any desired shape. In FIG. 2F, the gap fillers 208 are formed from different shapes—a circular disc disposed in the center of the reflector 210 and semicircular discs closer to the edge of the reflector 210. The semicircular discs are symmetrically disposed around the reflector 210, with each flat portion facing the circular disc. Thus, as shown, the centers of the semicircular discs are disposed at about 90° with respect to each other and each center being the same distance from the center of the circular disc such that pairs of semicircular discs are disposed symmetrically across from each other. The gap filler 108 can have a thickness and durability selected to reduce or eliminate a gap between the reflector 110 and the LGP 112. Due to the above compression, for example, the thickness of the different gap fillers may be different; for example, the thickness for the four semicircular pads may be about 3.8 mm (approximately 3/16 inch) while that of the center pad may be about 6.4 mm (approximately 1/4 inch). Reducing or eliminating the gap can reduce or eliminate shadowing caused by the gap fillers 208.

FIG. 2G shows a sectioned view of a portion of the light engine, in accordance with some embodiments. As above, the chassis 220 may have an inner cavity 220*a* in which the optical components are disposed and an outer cavity 220*b* in which wiring is disposed. The chassis 220, including the inner and outer cavities 220*a*, 220*b*, may be covered by the backplate 204. The wiring may include sets of both positive and negative wires 232*a*, 232*b* (one for each FPC 216) that are retained within the outer chassis 220*b* using tape applied to raised bosses 220*c* disposed at regular intervals throughout the outer cavity 220*b*. The combination of the tape, which may be aluminum tape for example, and the bosses 220*c* may help to ensure that the wires 232*a*, 232*b* stay retained within the outer cavity 220*b* and do not become pinched between the chassis 220 and the backplate 204. The wires 232*a*, 232*b* may exit the outer cavity 220*b* through an exit hole 204*b* in the backplate 204. The wires 232*a*, 232*b* may be secured with strain relief. In some embodiments, heat-shrink tubing may be used to secure the wires 232*a*, 232*b*. The wires 232*a*, 232*b* may be, for example, about 1.1 m in length (approximately 32 inch) wires having a diameter of about 1.6 mm (approximately 0.063 inch) (AWG22, stranded, 300V, 105° C., UL recognized).

FIG. 2H shows a perspective view of a portion of a light engine, in accordance with some embodiments. As can be seen, the FPCs 216 may each have LEDs 216*a* electrically attached thereto. The FPCs 216 may each have an extension that extends over the ridge 220*e* in the chassis 220. The FPCs 216 are separated by a gap 230 and aligned such that one of the locator pins 222 opposes the gap 230. The alignment helps to prevent light occlusion of the LEDs 216*a* by the locator pins 222.

The light engine may have an element present between the LEDs 216*a* and the external environment. The element may be an optical element such as a lens, a window or detector, such as a motion detector, and/or an opaque plate. A light diffuser may be formed from any material that diffuses or scatters light, e.g., a translucent material such as ground or greyed glass, or may use a diffraction element to scatter the light. The light from the light engine may be distributed symmetrically or asymmetrically. For example, the light from the light engine may be distributed over a substantially semi-circular range (or, for example, about 120° to about 180° range). The asymmetric distribution may be accomplished using one or more of a number of different techniques, including limiting the LED distribution in the light engine to provide the desired radiation pattern, using a reflector within the light engine to direct light from the LEDs to the desired radiation pattern, and/or providing an optical element to direct the light from the LEDs to the desired radiation pattern, among others. Such a light engine may be used, for example, to provide lighting indoor or outdoor environment in which a greater amount of illumination in a particular directional range is desirable.

The FPC shown may be split into two flexible half strips that cover about 180° and that may be controlled separately (as may the LEDs thereon). In various embodiments, the strips may cover an angular range different than 180°, the strips may cover the same or different angular ranges, and any number of strips may be used.

Figure 3A:
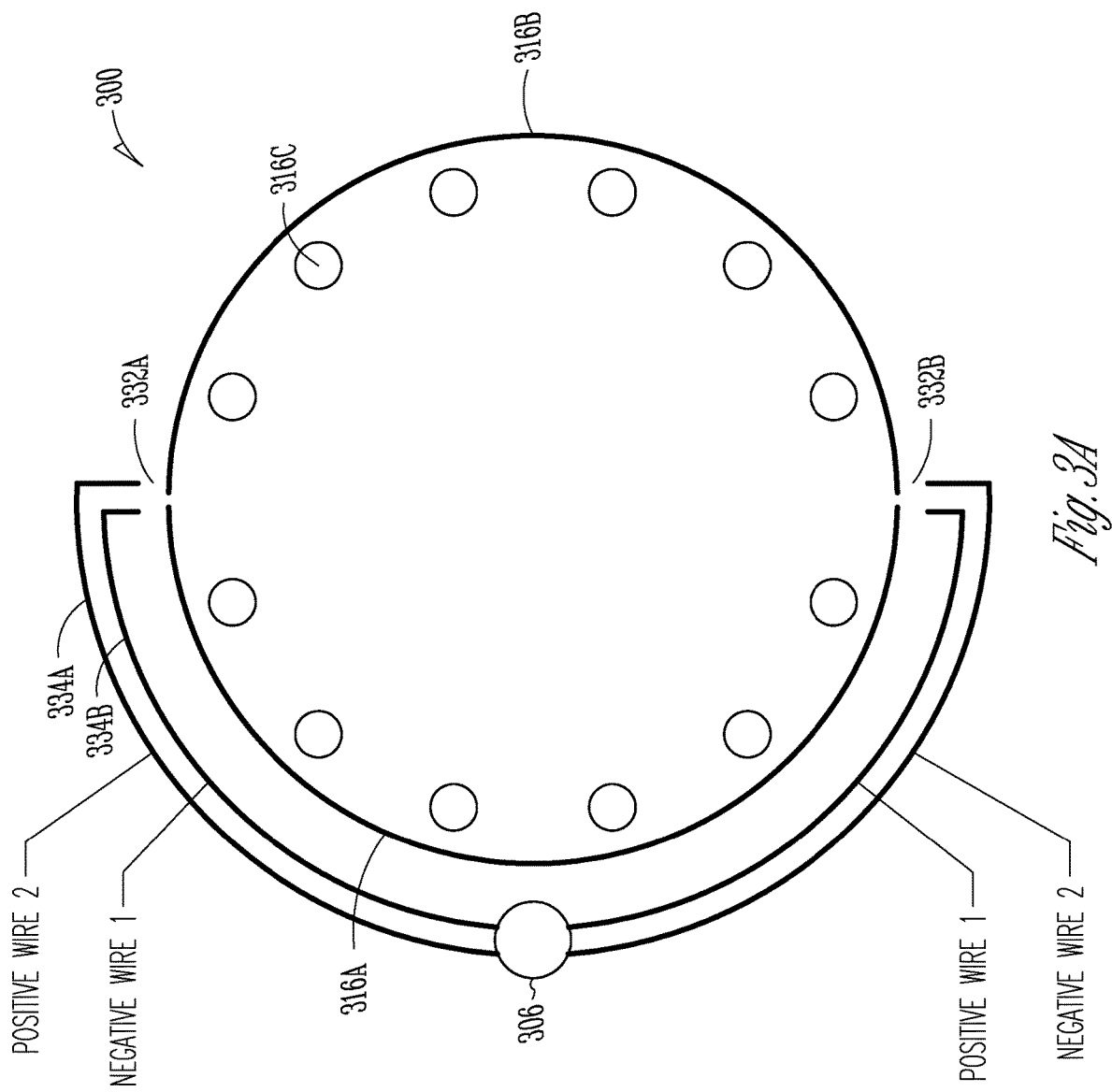
FIG. 3A shows an example of a symmetric LED design with uniform spacing, in accordance with some embodiments.
Figure 3B:
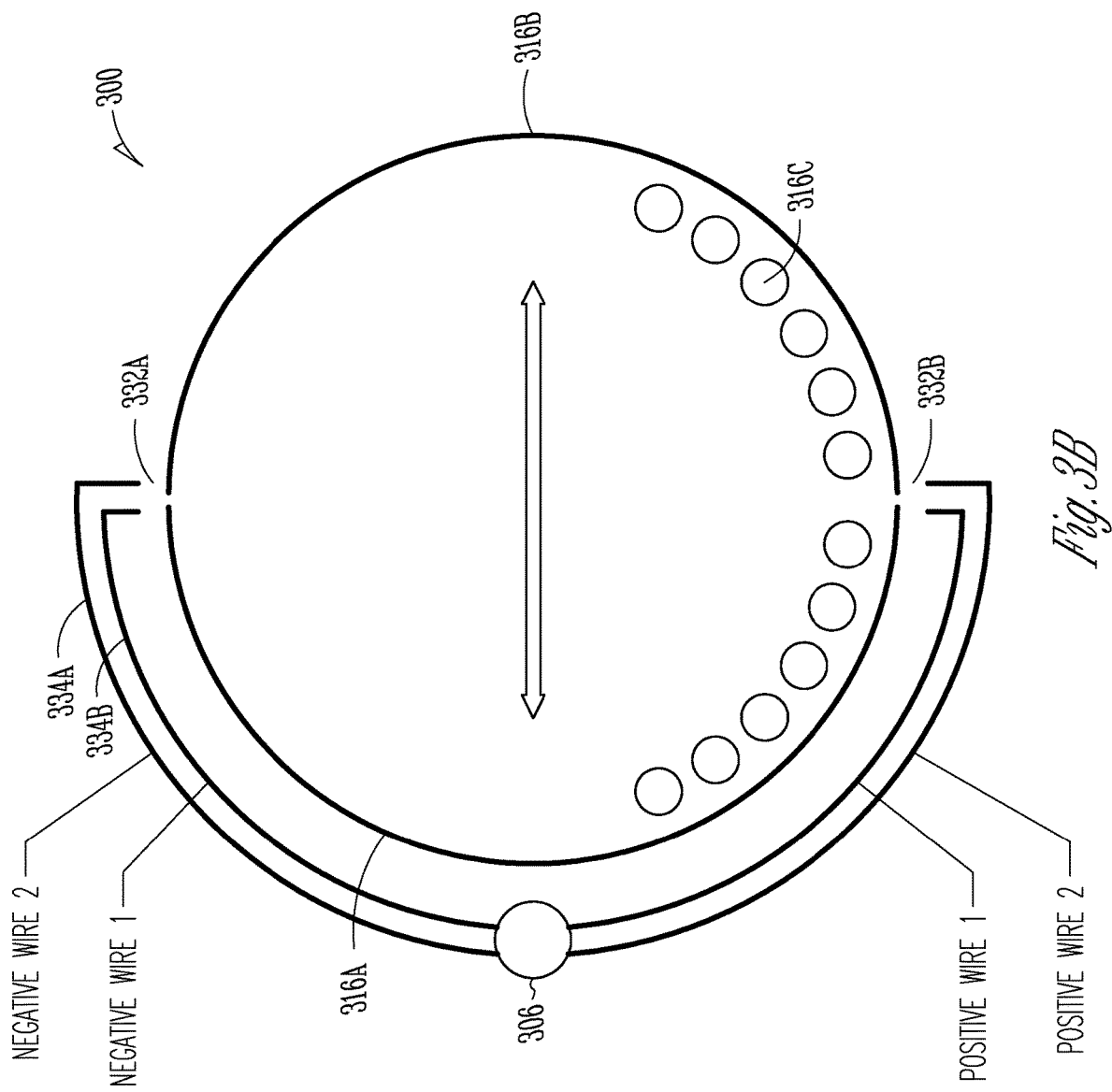
FIG. 3B shows an example of an asymmetric LED design, in accordance with some embodiments.

FIG. 3A shows an example of a symmetric LED design with substantially uniform spacing, in accordance with some embodiments; FIG. 3B shows an example of an asymmetric LED design, in accordance with some embodiments; FIG. 3C shows another example of a symmetric design, in accordance with some embodiments. Flexible half strips 316a, 316b of the light engine 300 may cover about 180°. Each flexible half strip 316a, 316b may contain multiple LEDs 316c. As shown, each flexible half strip 316a, 316b may contain 38 LEDs 316c having a uniform spacing therebetween. The LEDs may be contained in a package having a size of, for example, 5 mm×5 mm. As above, in various embodiments, the strips may cover an angular range different than 180°, the strips may cover the same or different angular ranges, and any number of strips may be used. In addition, the LEDs 316c on one or both of the flexible half strip 316a, 316b may have non-uniform spacing therebetween and/or the LEDs 316c on both of the flexible half strip 316a, 316b may have uniform spacing, but the pitches may be different between the flexible half strip 316a, 316b. Positive and negative wires 334a, 334b, used to separately control each of the flexible half strips 316a, 316b, may extend from the cable stress reliever 306. A positive wire and negative wire 334a, 334b may be connected to each of the flexible half strips 316a, 316b through AVX connectors 332a, 332b.

The example of FIG. 3B is similar to that of FIG. 3A, except that only a portion of each flexible half strip 316a, 316b may contain LEDs 316c. In FIG. 3B, about 30% of each flexible half strip 316a, 316b contains LEDs 316c, although in other embodiments a different percentage of each flexible half strip may contain LEDs (which may be the same or may be different for each flexible half strip). In FIG. 3B, the distribution of the LEDs 316c are symmetric with regard to each other but asymmetric along the length of each flexible half strip 316a, 316b. In some embodiments, the same number of LEDs on each flexible half strip 316a, 316b shown in FIG. 3A may be contained in each flexible half strip 316a, 316b of FIG. 3B (thus having a smaller uniform spacing), while in other embodiments the same uniform spacing shown in FIG. 3A may be used in FIG. 3B (thus having fewer LEDs). As above, the LEDs 316c on one or both of the flexible half strip 316a, 316b may have non-uniform spacing therebetween and/or the LEDs 316c on both of the flexible half strip 316a, 316b may have uniform spacing, but the pitches may be different between the flexible half strip 316a, 316b.

In FIG. 3C, similar in some ways to FIG. 3B, only a portion of each flexible half strip 316a, 316b may contain LEDs 316c. However, unlike FIG. 3B, in FIG. 3C, the distribution of the LEDs 316c are symmetric with regard to each flexible half strip 316a, 316b as well as each other. In FIG. 3C, about 40% of each flexible half strip 316a, 316b contains LEDs 316c, although in other embodiments a different percentage of each flexible half strip may contain LEDs (which may be the same or may be different for each flexible half strip). In some embodiments, the same number of LEDs on each flexible half strip 316a, 316b shown in FIG. 3A may be contained in each flexible half strip 316a, 316b of FIG. 3C (thus having a smaller uniform spacing), while in other embodiments the same uniform spacing shown in FIG. 3A may be used in FIG. 3C (thus having fewer LEDs). As above, the LEDs 316c on one or both of the flexible half strip 316a, 316b may have non-uniform spacing therebetween and/or the LEDs 316c on both of the flexible half strip 316a, 316b may have uniform spacing, but the pitches may be different between the flexible half strip 316a, 316b.

Figure 4A:
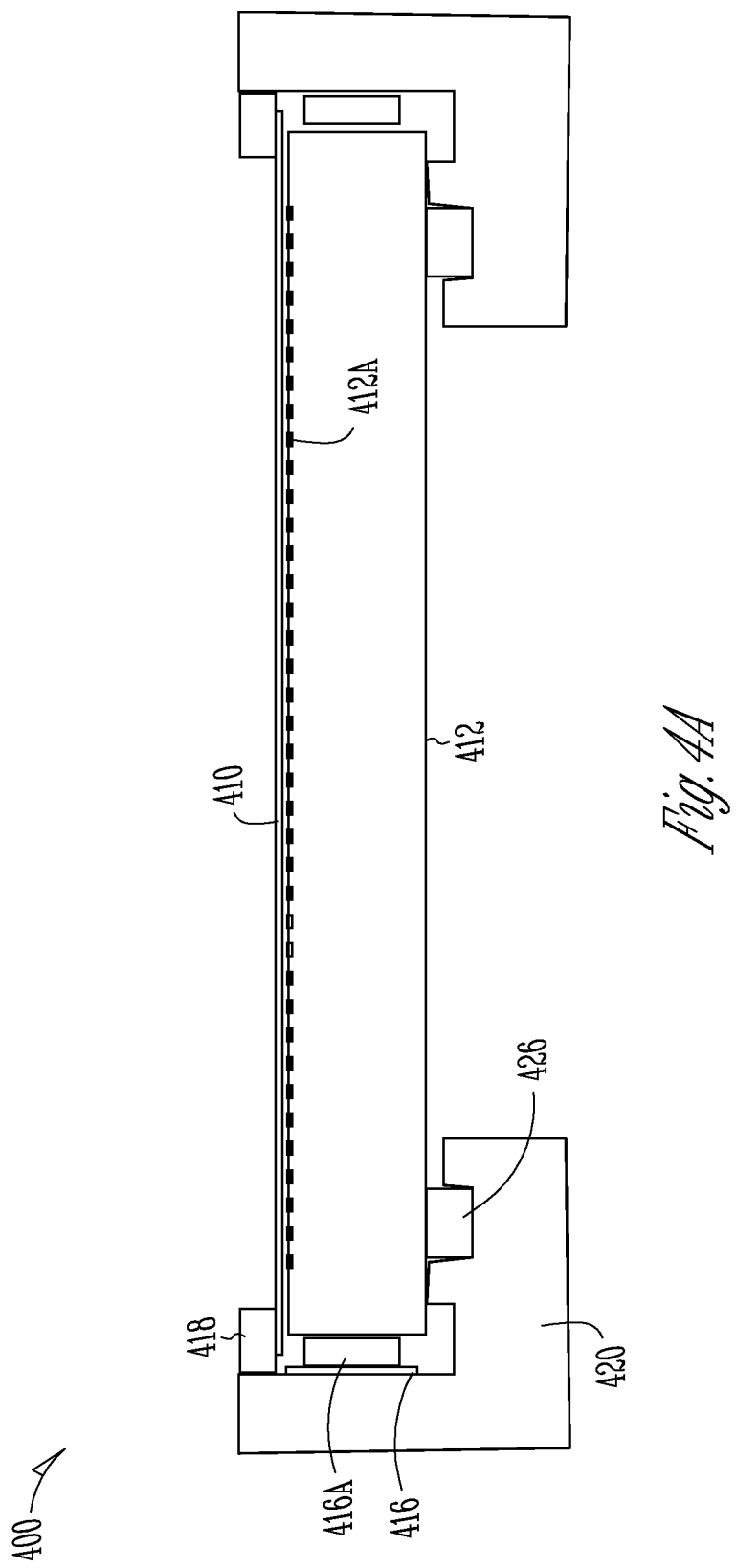
FIG. 4A shows a simplified geometric model of a light engine, in accordance with some embodiments.

FIG. 4A show simplified geometric models of a light engine, in accordance with some embodiments. The light engine 400, as above, may contain a frame 420 in which are situated LEDs 416a, an LGP 412 (e.g., which is about 4 mm thick in some embodiments) and a reflector 410. As above, the LEDs 416a may be disposed on the frame 420 and face inward, towards the LGP 412. The reflector 410 may be disposed on the LGP 412 and may have a diameter of about 383.5 mm. The notch formed in the LGP 412 for seating the LGP 412 via the locator pins may have a depth of about 3.97 mm, a width of about 1.8 mm and a length of about 2.54 mm. A dispersive pattern 412a, such as dots, may be formed on a surface of the LGP 412 opposite the reflector 410. In some embodiments, the dispersive pattern 412a may be disposed uniformly over only the surface of the LGP 412 opposite the reflector 410. The dispersive pattern 412a may extend radially from the center of the LGP 412 to terminate before reaching the edge of the LGP 412. For example, if the diameter of the LGP 412 is about 382 mm, the diameter of the dispersive pattern 412 may be about 366 mm. The thick LGP 412 and a reflector 410 may be retained in the inner cavity in the frame 420, disposed between the frame 420 and a ring 418. A gasket 426 is retained within a recess in the frame 420 under the LGP 412 to avoid ingress of liquid or other contaminants into the outer cavity where the LED 416a and other electronics are present. The reflector 410, frame 420 and ring 418 may all be formed from a metal, such as aluminum.

FIG. 4B shows another simplified geometric model of a light engine, in accordance with some embodiments. FIG. 4B shows additional components, compared with FIG. 4A. A backplate 404 is attached to the chassis 420 via connectors, with foam spacers 408 disposed between the backplate 404 and the reflector 410 to provide additional pressure on the reflector 410 over the entire surface of the reflector 410. The reflector 410 may be retained in the chassis 420 using, for example, electrical tape 428 disposed on both sides of the edges of the reflector 410. The electrical tape 428 may be retained between and contact both the backplate 404 and the chassis 420.

FIG. 4C shows another simplified geometric model of a light engine, in accordance with some embodiments. FIG. 4C is slightly different from FIG. 4B. Unlike FIGS. 4A and 4B, however, the backplate 404 does not directly contact the reflector 410. Instead, in FIG. 4C, the reflector diameter is reduced to meet the minimum UL clearance distance of 1.6 mm (having a diameter of about 380 mm rather than 383.5 mm) and a white reflective sheet 430 is disposed over the entire surface of the reflector 410. The reflective sheet 430 may be formed, in one embodiment, from plastic (e.g., polyethylene terephthalate (PET)) and is in direct contact with the backplate 404. The reflective sheet 430 may be taped to the reflector 410 using double-faced sticky tape having a UL maximum temperature of 85° C. or higher. This avoids the use of the tape at the edges of the reflector 410 and improves the flatness of the reflector 410.

Figure 4D:
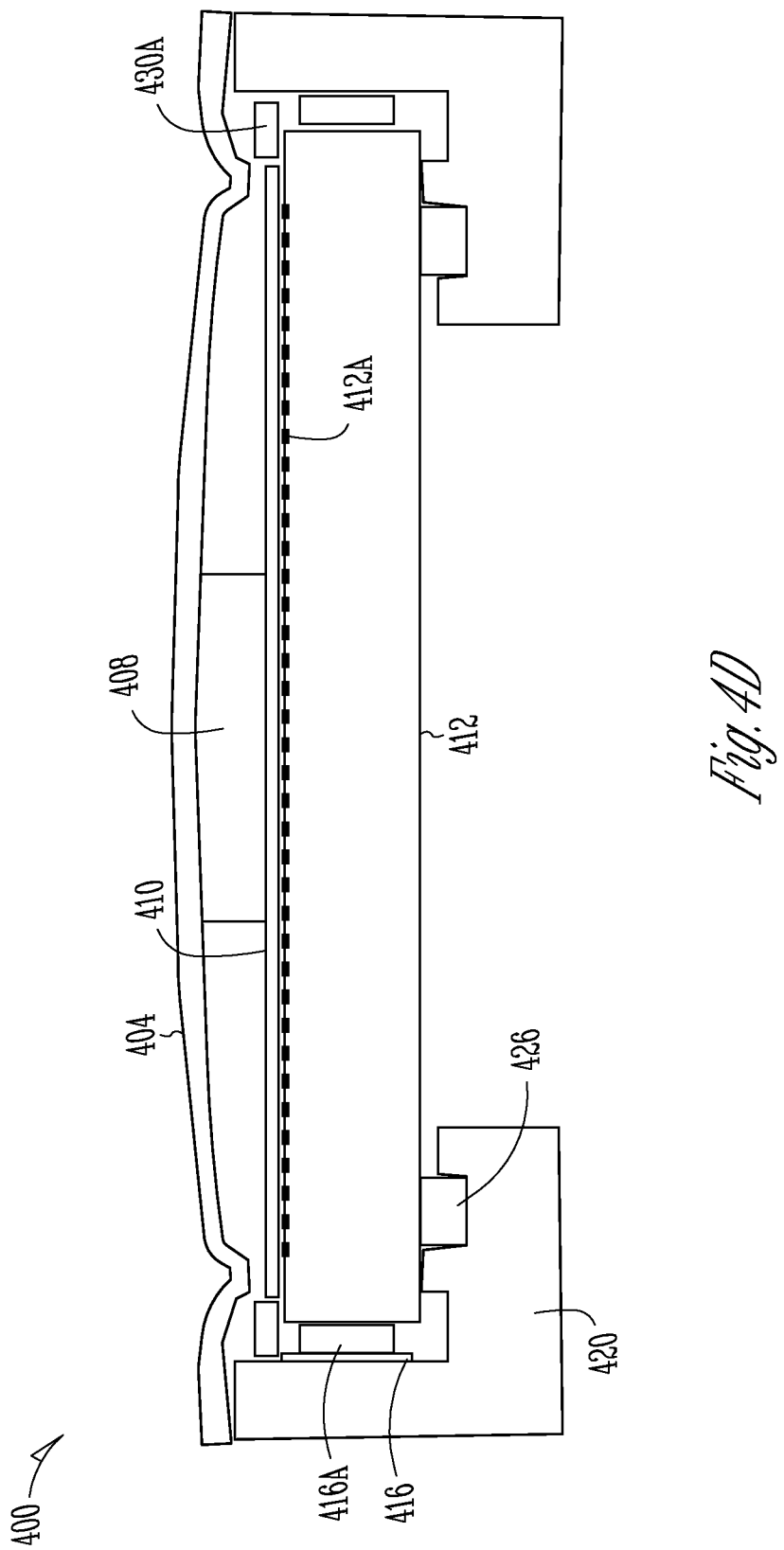
FIG. 4D shows another simplified geometric model of a light engine, in accordance with some embodiments.

FIG. 4D shows another simplified geometric model of a light engine, in accordance with some embodiments. FIG. 4D is slightly different from FIG. 4C. Unlike FIG. 4C, however, while the reflector diameter is again reduced to meet the minimum UL clearance distance of 1.6 mm, a reflective sheet 430 is not present over the entire surface of the reflector 410. Instead, in FIG. 4D, a reflective material 430a is disposed over the edge of the LGP 412 and adjacent to the edge of the reflector 410. The reflective material 430a is formed, in one embodiment, from plastic (PET). In some embodiments, the reflective material 430a may be formed in a ring around the entire circumference of the reflector 410. In other embodiments, rather than a ring, the reflective material 430a may be formed in quadrants or spacers that are connected together (e.g., by tape) but that again avoid the use of tape at the edge of the reflector 410.

Figure 4E:
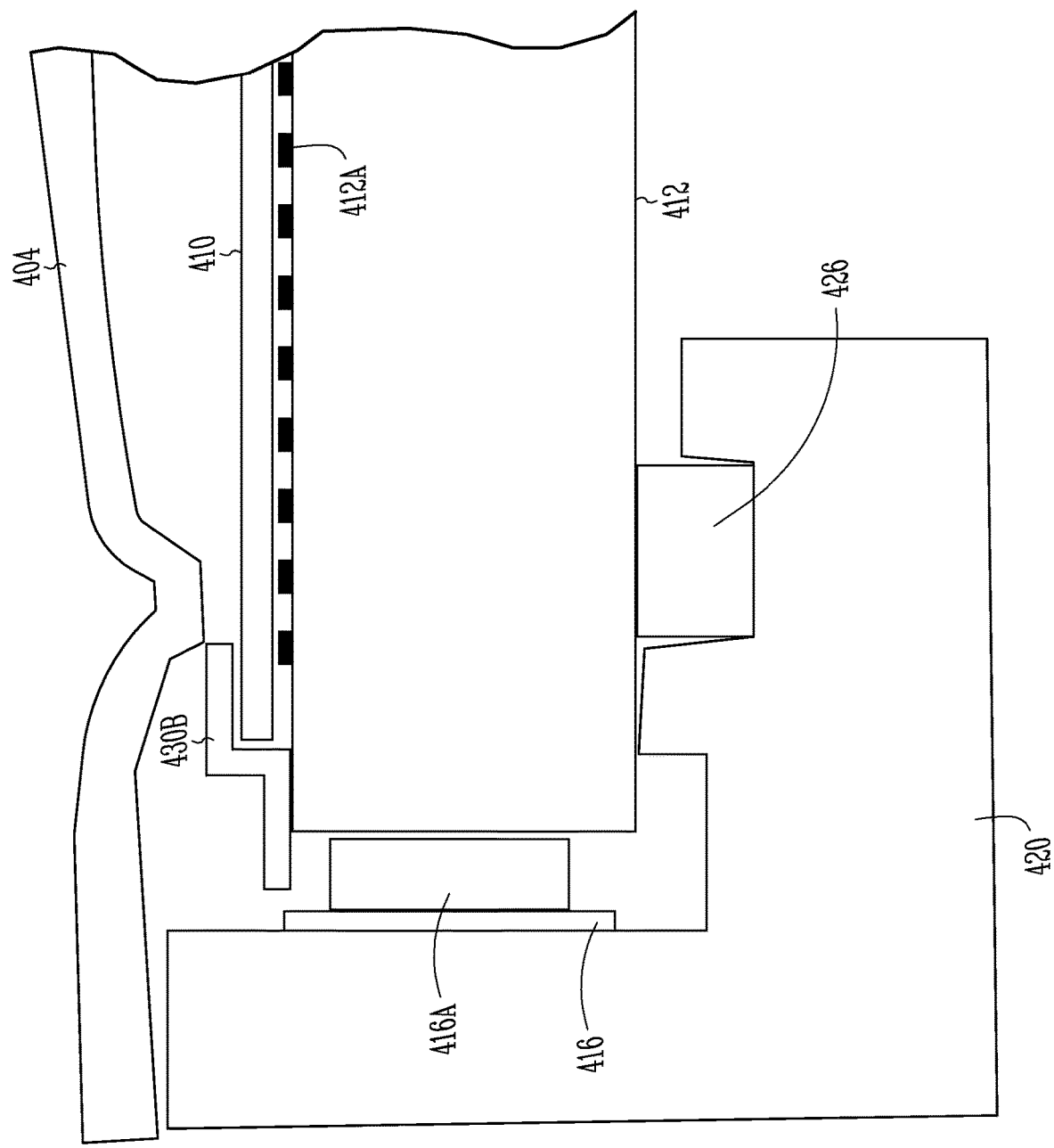
FIG. 4E shows an enlarged simplified geometric model of a portion of a light engine, in accordance with some embodiments.

FIG. 4E shows an enlarged portion of a simplified geometric model of a light engine, in accordance with some embodiments. FIG. 4E is similar to FIG. 4D. The LGP 412 and the reflector 410 may be retained in the inner cavity in the frame 420, disposed between the frame 420 and reflective material 430b. A backplate 404 is attached to the chassis 420 via connectors. As with FIG. 4D, the reflector diameter is again reduced to meet the minimum UL clearance distance of 1.6 mm, with the reflective material 430b being tape that is disposed over the edge of the LGP 412 and adjacent to the edge of the reflector 410. The reflective material 430b may be, for example, white. The reflective material 430b may be further attached to a top of the reflector 410. In some embodiments, the reflective material 430b may be formed in a ring around the entire circumference of the reflector 410. In other embodiments, rather than a ring, the reflective material 430b may be formed in quadrants or spacers. The reflective material 430b may be attached to the reflector 410 after compression of the reflector 410 to remove or reduce the air layer between the reflector 410 and the LGP 412 to remove or reduce the air layer therebetween and thus prevent the re-entry of air to prevent the formation of gaps.

In some embodiments, a high reflectivity side layer or ring is disposed adjacent to the edge of the reflector 410. In some embodiments, the side layer or ring may be formed in a ring around the entire circumference of the reflector 410. In other embodiments, rather than a ring, the side layer may be formed in quadrants or spacers. The side layer prevents light from escaping and getting absorbed by the backplate 404.

In some embodiments, if reflector diameter meets the minimum UL clearance distance of 1.6 mm, a transparent double-sided sticky adhesive may be applied over the LGP 412 to attach the reflector 410 and the LGP 412 together. The double-sided sticky adhesive may extend over the entire LGP 412 but stick only to the top of the dispersive pattern 412a to maintain a sufficient refractive index step. Alternatively, the dispersive pattern 412a may itself have adhesive to attach the reflector 410 and the LGP 412 together. In other embodiments, the double-sided sticky adhesive may extend over only the reflector 410, leaving the edges of the LGP 412 uncovered, and stick only to the top of the dispersive pattern 412a to maintain a sufficient refractive index step. In other embodiments, the double-sided sticky adhesive may extend over only the edges of the LGP 412 and the reflector 410 to attach the reflector 410 and the LGP 412 together at those points instead of being applied to the dispersive pattern 412a.

In various embodiments after assembly of the light engine, a protective film may be applied to the LGP when disposed within the chassis. The film may be, for example, a polyethylene or other type of plastic film that is attached to the LGP using an adhesive. In some embodiments, the film may be about 50 μm thick. The film may have a diameter of about 341 mm to cover the LGP. In some embodiments, the adhesive rating may be 150 g/25 mm. In some embodiments, the film may have a pull tab for the end user to remove the film. The pull tab may be folded over the film to avoid entrapment during assembly and may face a marking on the chassis.

A dispersive pattern is formed on the LGP and may also be formed on an exit surface of the light engine. The dispersive pattern may contain dots having relatively randomized locations and sizes to reduce susceptibility to Moiré fringe formation. The sizes of individual dots may be, for example, between about 0.1 mm and about 2 mm. The dots may not overlap and, in fact may have a separation between adjacent dots, for example, between about 0.1 mm and about 2 mm. Poisson-disc sampling randomization is one of several available algorithms that can produce "short-range order" or quasi-random patterns for the dot pattern of the light-guide plates lenses. Such patterns are desired to reduce or suppress the susceptibility of the dots pattern to generate Moiré fringes when in proximity with a specular or mostly specular reflector. Moiré fringes are formed by the amplitude superposition of the two images. Poisson-disc sampling is an algorithm to generate the dot patterns. Additional parts or elements can use this algorithm to fill the interstices which can be filled by dots. The "short-range order" or quasi-random patterns also allow to have sufficient density of the dots as to not impact negatively the optical efficiency. The use of the dispersive pattern, instead of or in conjunction with, the spacing between the LGP and the reflector (e.g., formed by the tape at the edge of the reflector) may prevent generation of the Moiré pattern.

Figure 5C:
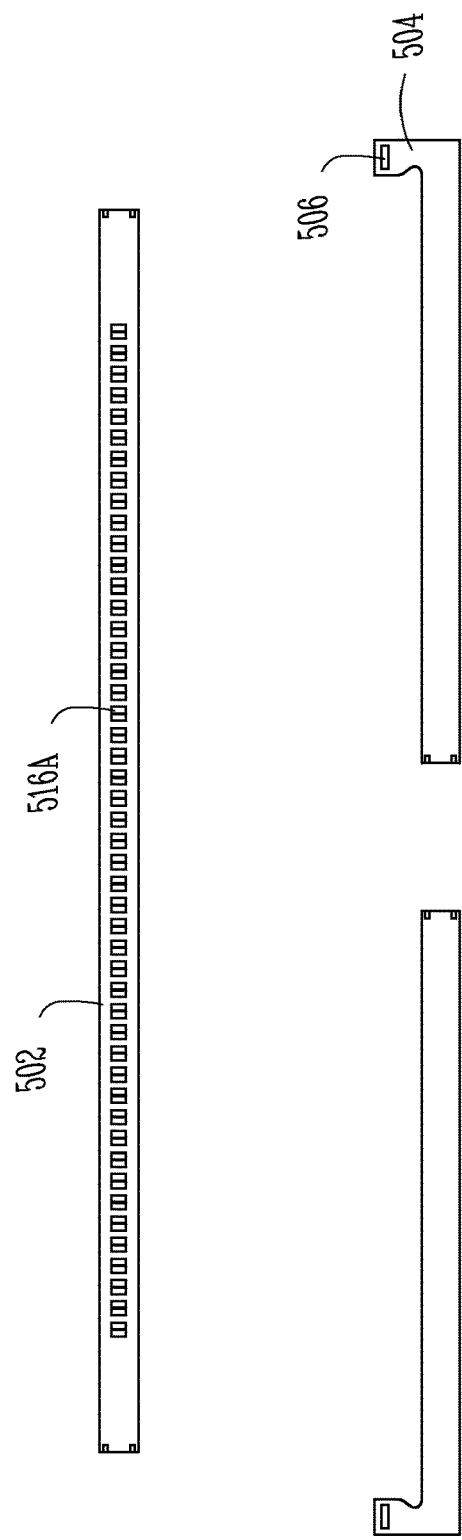
FIG. 5C shows another example of an FPC in accordance with some embodiments.

FIGS. 5A-5C show examples of an FPC 500 in accordance with some embodiments. In some symmetrical LED embodiments, as shown in FIG. 5A, each FPC 500 may contain 24 LEDs 516a having a pitch of about 15.875 mm and centered in height within the FPC 500. As shown, the FPC 500 may have an "L" shape with a main portion 502 and one end having an extension 504 that extends in the height direction, to which an electrical connector is soldered or otherwise connected at a connection point 506. In some embodiments, the extension 504 has a thickness of about 11 mm and a width of about 25 mm (rather than the 11.5 mm width of the main portion 502 of the FPC 500). In some embodiments, the distance from the center of the LED 516a closest to the end of the FPC 500 having the extension 504 to the edge of the FPC 500 having the extension 504 may be about 7.938 mm. In some embodiments, the end of the FPC 500 having the extension 504 to the edge of the FPC 500 having the extension 504 may be about 7.938 mm.

In some asymmetrical LED embodiments, as shown in FIG. 5B, one of the FPC 500 may contain all 38 LEDs 516a. The LEDs may have a pitch of about 6.5 mm and centered in height within the FPC 500. In some embodiments, the distance from the center of the LED 516a closest to the end of the FPC 500 having the extension 504 to the edge of the FPC 500 having the extension 504 may be about 3.1 mm. In this case, the LEDs 516a may be asymmetric both around the entire light engine (not shown in FIG. 5) and along the FPC 500, with the LEDs 516*a* being closer to the edge of the FPC having the extension 504.

In other asymmetrical LED embodiments, as shown in FIG. 5C, the distance from the center of the LED 516*a* closest to the end of the FPC 500 to the edge of the FPC 500 may be about 37.75 mm. In this case, the LEDs 516*a* may be asymmetric around the entire light engine 200, but symmetric within the FPC 500. Note that in all of the embodiments shown in FIGS. 5A-5C, one or more extensions may be used to vary color distribution or intensity distribution of light produced by the LEDs 516*a*.

Figure 6:
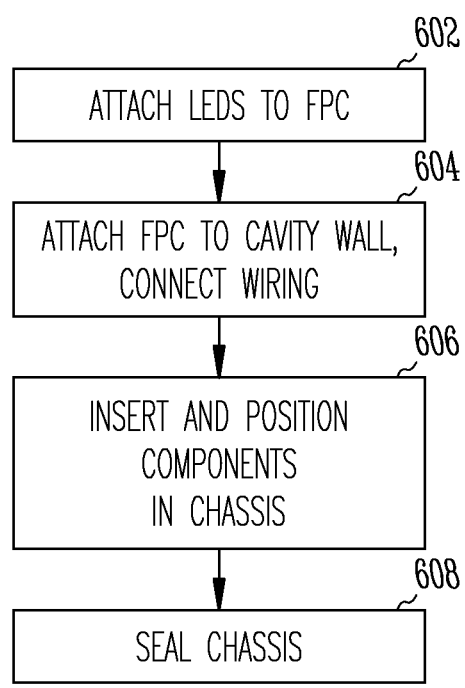
FIG. 6 shows an example of a flowchart for assembling the structures in accordance with some embodiments.

FIG. 6 shows an example of a flowchart for assembling the structures in accordance with some embodiments. Other steps, as described above, may be undertaken but are not shown for convenience. The order of the steps may also be different than that shown. In step 602, the LEDs may be mounted or attached to the FPC. As above, the attachment may be implemented, for example, by soldering the LEDs to the FPC. At operation 604, the FPC may be attached to the wall of an inner cavity of the chassis. For example, the FPC may be bent around the wall and extend to an outer cavity of the chassis. Wiring may then be connected to the FPC and extend throughout the outer cavity, being coupled to raised bosses within the outer cavity to retain the wiring in the outer cavity.

At operation 606, various components can be inserted into the inner cavity of the chassis. The components may include, among others, a gasket, which is inserted into a recess formed in a bottom surface of the cavity, as well as locator pins inserted into other recesses formed in a bottom surface of the cavity such that the locator pins extend into the cavity. Components such as a light guide plate and reflector may then be positioned in the cavity. The light guide plate, for example, may be positioned in the cavity such that a first surface of the light guide contacts the gasket and an edge of the light guide opposes the LEDs and is configured to receive light emitted by the LEDs. The light guide may have slots configured to receive the locator pins therein and be retained in the cavity by coupling the locator pins in the slots. A reflector may also be positioned in the cavity such that the reflector entirely or nearly entirely covers the light guide and is configured to reflect substantially all light incident on the reflector from the light guide back toward the light guide. At operation 608, the chassis may be sealed after all the components are inserted and positioned therein by attaching a backplate to the chassis via screws or other coupling mechanisms.

Figure 7A:
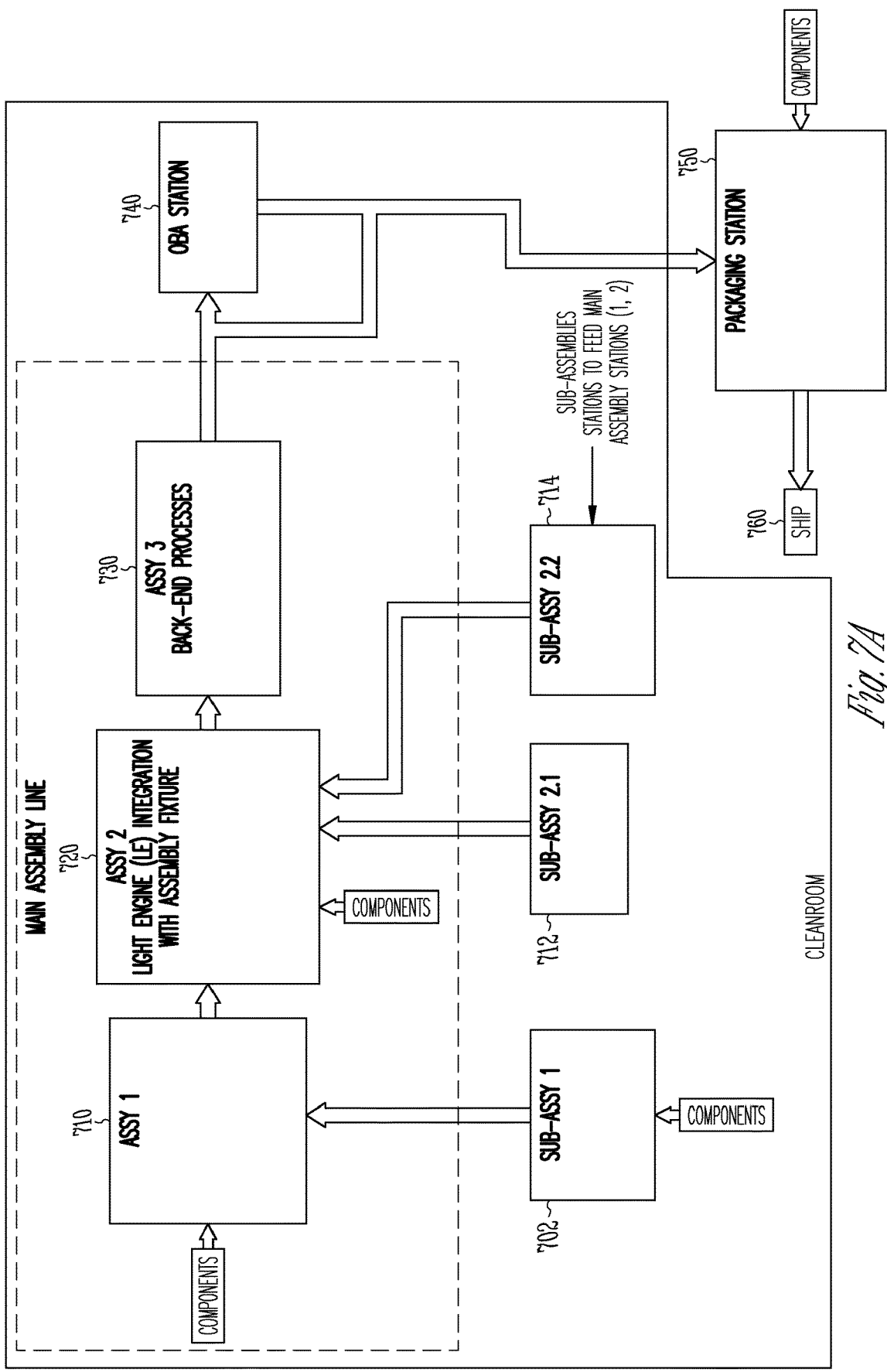
FIG. 7A shows an example of a flowchart for assembling the structures in accordance with some embodiments.

FIG. 7A shows another example of a flowchart of an assembly process in accordance with some embodiments. Although various operations are described below, some of the operations may be omitted in different embodiments, and other operations may be undertaken added. In addition, at least some of the operations described within each process may be in a different order than that described. The assembly shown in FIG. 7 may occur in a plurality of assembly and sub-assembly stages that are located in a cleanroom, for example, a class 10,000 (ISO 7) or 100,000 (ISO 8) cleanroom. Although the cleanroom can be any class, practically it may be desirable to limit the cleanroom to ISO 7 or higher due to cost considerations. The assembly and sub-assembly stages may be in different physical locations and may each contain a work station and storage areas to store components used in the process and the output of the work station. The work station may include as one or more benches (or tables) and/or specialized equipment to enable the process at the location to be undertaken, such as measuring tools to measure the pin holes, implements to insert locator pins in the pin holes, applicators to apply cleaning solution, implements to route and secure wiring within the chassis, equipment to retain and illuminate the LGP prior to insertion into the chassis as well as measure Moiré patterns, implements to shape and apply foam retainers, and clamps to retain different components, among others.

Figure 7B:
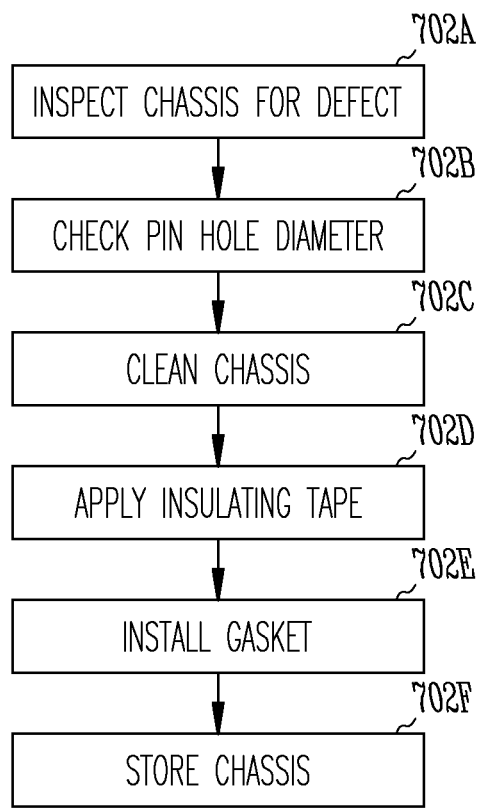
FIG. 7B shows an example of the first sub-assembly process of FIG. 7A for assembling the structures in accordance with some embodiments.
Figure 7C:
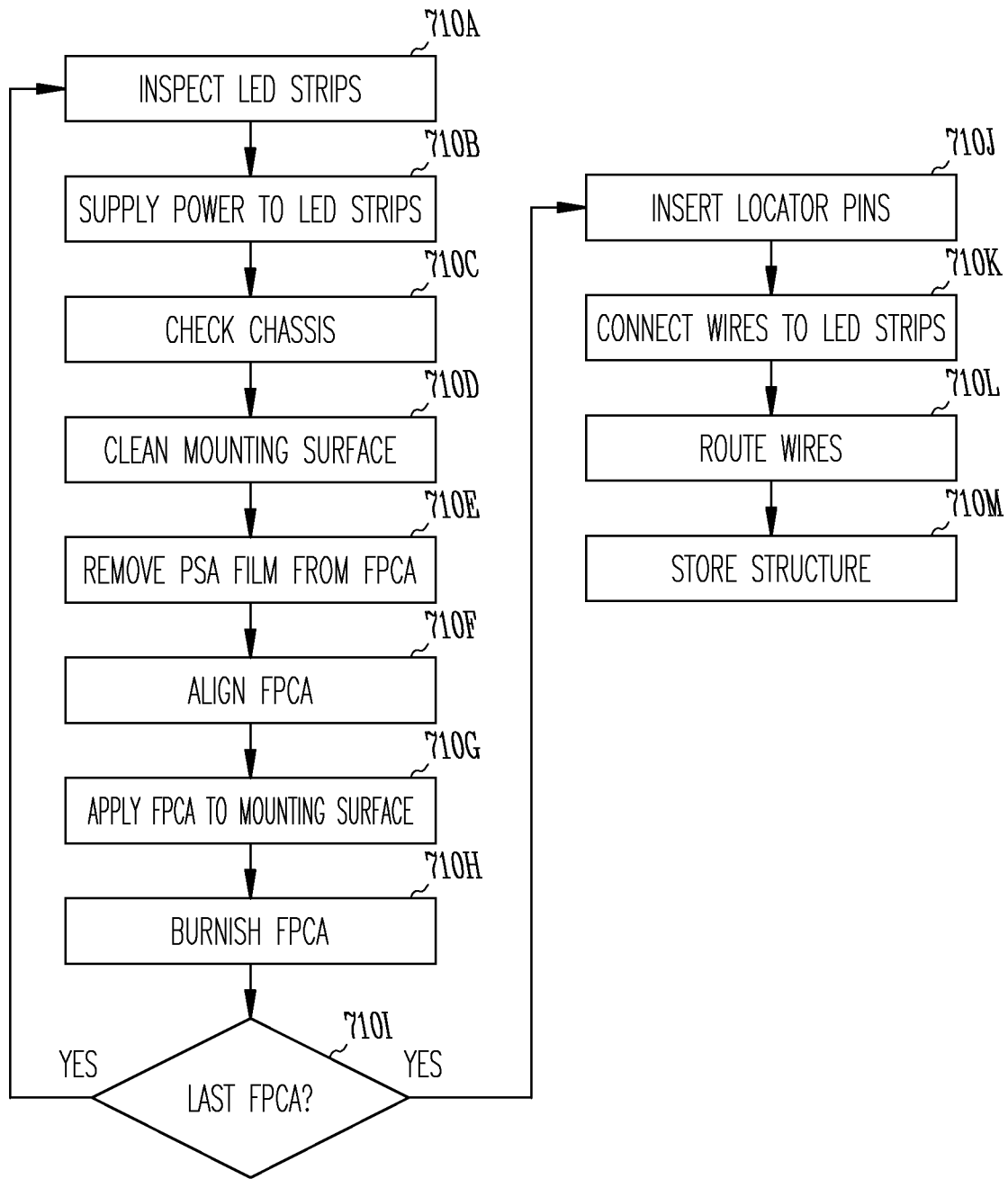
FIG. 7C shows an example of the first assembly process of FIG. 7A for assembling the structures in accordance with some embodiments.
Figure 7D:
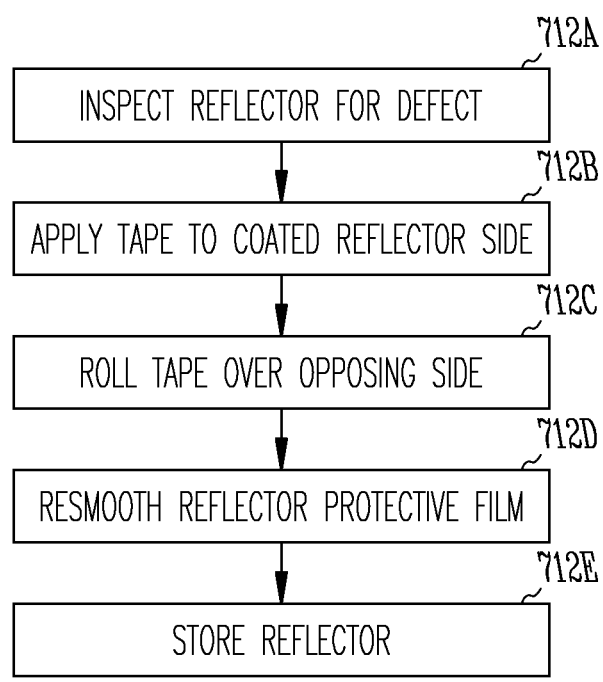
FIG. 7D shows an example of the second sub-assembly process of FIG. 7A for assembling the structures in accordance with some embodiments.
Figure 7E:
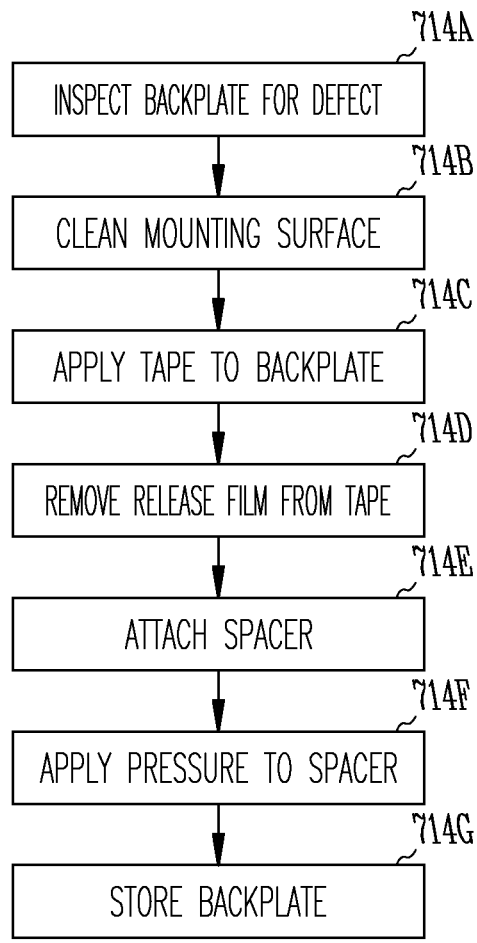
FIG. 7E shows an example of the third sub-assembly process of FIG. 7A for assembling the structures in accordance with some embodiments.
Figure 7F:
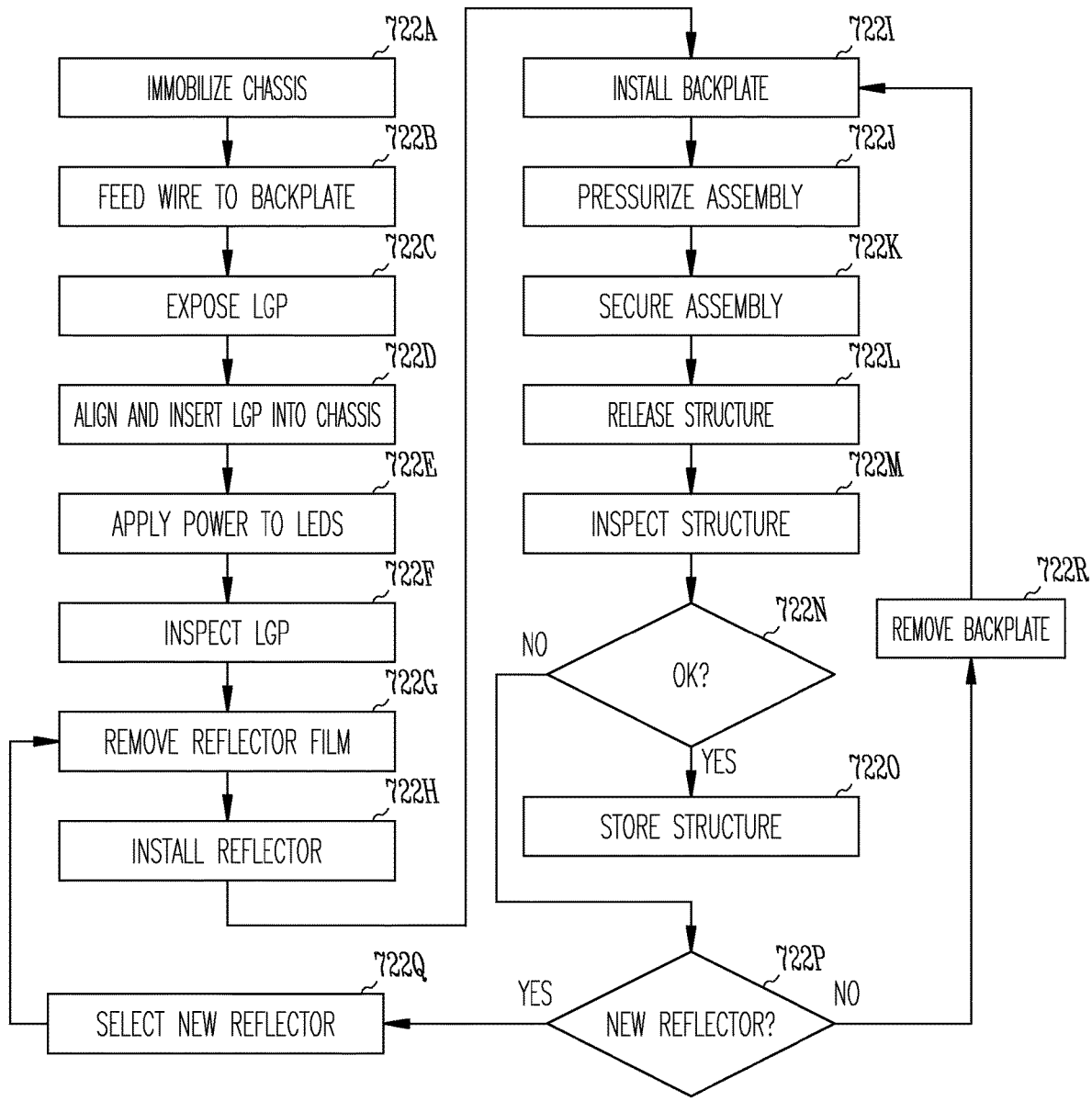
FIG. 7F shows an example of the second assembly process of FIG. 7A for assembling the structures in accordance with some embodiments.
Figure 7G:
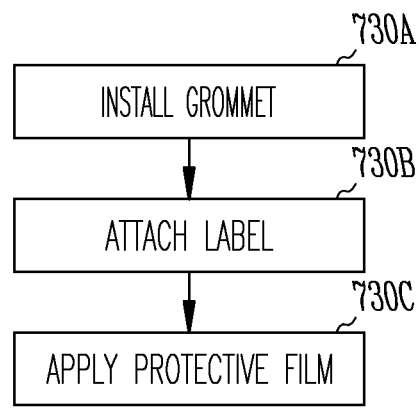
FIG. 7G shows an example of the third assembly process of FIG. 7A for assembling the structures in accordance with some embodiments.
Figure 7H:
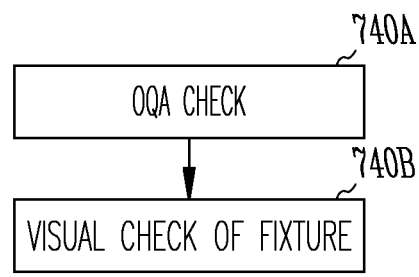
FIG. 7H shows an example of the fourth assembly process of FIG. 7A for assembling the structures in accordance with some embodiments.

Both assembly processes 710, 720, 730, 740 and sub-assembly processes 702, 712, 714 are present in the cleanroom. Various components are provided to the different assembly processes 710, 720, 730 and sub-assembly processes 702, 712, 714. Specifically, the (assembly) fixture may be assembled during the first assembly process 710. Prior to performing the first assembly process 710 however, a first sub-assembly process 712 may be performed. FIG. 7B shows an example of the first sub-assembly process of FIG. 7A for assembling the structures in accordance with some embodiments. FIG. 7C shows an example of the first assembly process of FIG. 7A for assembling the structures in accordance with some embodiments. FIG. 7D shows an example of the second sub-assembly process of FIG. 7A for assembling the structures in accordance with some embodiments. FIG. 7E shows an example of the third sub-assembly process of FIG. 7A for assembling the structures in accordance with some embodiments. FIG. 7F shows an example of the second assembly process of FIG. 7A for assembling the structures in accordance with some embodiments. FIG. 7G shows an example of the third assembly process of FIG. 7A for assembling the structures in accordance with some embodiments. FIG. 7H shows an example of the fourth assembly process of FIG. 7A for assembling the structures in accordance with some embodiments.

The first sub-assembly process 702 may employ the chassis, gaskets and tape, as described above. In operation, the first sub-assembly process 702 may include an internal quality check (ICQ) of the chassis to ensure that the chassis is not damaged, and if the chassis passes the ICQ. As shown in FIG. 7B, during the ICQ of the chassis, the chassis is inspected for deformation of the metal forming the chassis or any other obvious mechanical defects in the chassis at operation 702*a*. Note that as used herein, defect determination (whether mechanical or optical), is in some embodiments limited to determining defects outside of a predetermined nominal range of defect (e.g., mechanical defects under about 1mm or optical defects, either of which are unable to be noticed by a manual visual inspection by a user with normal 20/20 vision). The pin hole diameter for the locator pins is also checked at operation 702*b* using a pin gauge during the first sub-assembly process 702. After the inspection for defects and pin hole diameter, the chassis is inspected for residue or transferable contaminants and subsequently cleaned by, among others, wiping away or otherwise removing any contaminant at operation 702*c*. Tape used to insulate the flexible printed circuit (FPC)/LED strips is then applied to the chassis at the location where the FPCs abut the chassis at operation 702*d*. The first sub-assembly process 702 further includes at operation 702*e* installing the gasket(s) used to seal the assembly into the groove in the chassis. The assembly is then stored at operation 702*f* in the cleanroom until ready for further assembly.

The first assembly process 710 employs the FPC, wires, pins and tape. The first assembly process 710, as shown in FIG. 7C, may include an ICQ of the LED strips. The ICQ of the LED strips may include at operation 710*a* a visual inspection of, as well as supplying power to at operation 710*b*, each LED strip to determine whether each LED on the LED strip lights up. The chassis is also checked at operation 710*c* to determine whether the chassis is sufficiently clean to allow the FPC to be laminated on the chassis. If not, any detritus may be removed, and the process continued. If so, the LED mounting surfaces of the chassis are further wiped with a cleaning solution such as isopropyl alcohol (IPA) at operation 710d.

The back of the FPC may be coated with a pressure sensitive adhesive (PSA) on which a PSA release film is disposed. After cleaning with IPA, the PSA release film attached to the back of the FPC is progressively peeled back at operation 710e to avoid drying the PSA on the back of the FPC. At operation 710f, the end of the FPC is aligned with the light guide dowel pin hole to ensure proper LED alignment of the assembly, i.e., that the light guide pin, when inserted, will not block any of the LEDs of the LED strip. In addition, the FPC is aligned with the chassis trench floor such that the bottom edge of the LED strip is coincident with the chassis trench floor (a Computer Numerical Control (CNC)-machined surface) along the length of the LED strip. Pressure is then applied at operation 710g against the LEDs and/or flat surfaces of the FPC between the LEDs, with the PSA release film continuing to be peeled off until the entirety of the FPC is mounted on the chassis. In some embodiments, a minimum of about 5 psi or about 90 g/5×5 mm² (LED size) may be applied for at least is for lamination of the FPC on the rigid chassis wall. A rubber coated tool may be used to burnish the FPC to the chassis at operation 710h. This procedure is then repeated for mounting of one or more other FPCs, as shown by the loop indicated by operation 710i.

The mounting surfaces, the LED strips are thus laminated to the chassis. After lamination of the LED strips, the locator pins are inserted in the chassis at operation 710j to enable the LGP to be positioned within the chassis. The locator pins may be placed in the chassis by hand or a tool, such as needle nosed pliers.

The wires that supply power to the FPC and LED strips are then integrated into the system, which may include connecting the wires to the FPC at operation 710k and routing the wires through the chassis at operation 710l. For example, each of the four wires to be connected may have a different color and has a shorter stripped section, pre-bent at about 90 degrees. To connect the wires to the FPC, the proper wire color is located for the connector location of the LED strip using a wire location template. The end of the wire so determined is retained by hand or using a tool, and the shorter section inserted into the connector at the proper location (aligned with the color). Once inserted, the wire is retained by the connector. The wire is gently tugged to ensure that the wire is locked in place. This process is repeated for the remaining wires. After the wires are securely fastened in the connector, the wires are routed through the channel formed by the outer cavity using sections of tape to hold the wires in place. As above, after assembly, the structure may be stored in the cleanroom until ready for final integration at operation 710m.

The second assembly process 720 may contain second and third sub-assembly processes 722, 724. The second sub-assembly process 722, as shown in FIG. 7D, involves ICQ of the reflector and installation of the edge tapes. In particular, during the second sub-assembly process 722, the surface of the reflector is visually inspected for deformation of metal or obvious defects at operation 712a. In some embodiments, a laser line inspection technique may be added to the visual inspection, in which case reflection of a laser beam that impinges on the reflector surface is used to determine whether defects are present.

After inspection is completed and the reflector is determined to have no defects, precut insulation tape is applied to the edge of the reflector at operation 712b. Specifically, the reflector is covered in a protective film. The edge of the protective film is rolled back, for example, one quarter section at a time. The tape is applied to the coated (reflective) side of the reflector that is free from the protective film. The applied tape is then rolled over the edge of the reflector at operation 712c to the backside of the reflector so that excess tape gathers uniformly. The protective film is subsequently smoothed back over the tape at operation 712d. The tape-containing reflector is stored until ready for final integration at operation 712e.

The third sub-assembly process 724 as shown in FIG. 7E involves ICQ of the backplate and installation, if present, of the foam spacer and double-sided tape to attach the spacer. More specifically, at operation 714a the backplate is visually inspected for deformation of metal or obvious defects. If no defects are found, the spacers are applied, in some embodiments after cleaning (removing residue) the backplate. In particular, the mounting surface of the backplate is wiped (e.g., using IPA) to ensure that the mounting surface is dry and contaminant free at operation 714b. The double-sided tape is then cut to a desired size and applied to a center of the backplate at operation 714c. A release film, which is present on one side of the double-sided tape, is then removed at operation 714d. The spacer is then attached to the double-sided tape using an alignment template at operation 714e. As shown, the spacer in the center of the backplate may be a disk that is centered at the center of the backplate. Pressure is then applied to the spacer for at least about 30 s at operation 714f. The pressure may be applied, for example, by hand. Other foam spacers, such as the semi-circular disks described above, if present, may be applied to the mounting surface of the backplate in the same manner. The backplate is then stored until ready for final integration at operation 714g.

The second assembly process 720 as shown in FIG. 7F includes integration of the light engine with the assembly fixture provided from the first assembly process 710 with the reflector and backplate assemblies from the second and third sub-assembly processes 722, 724, as well as providing the LGPs and screws or other fasteners to retain the components in the chassis. In particular, during the second assembly process 720, the chassis is essentially immobilized before assembly of the components produced by the second and third sub-assembly processes 722, 724. The chassis is essentially immobilized at operation 722a by placing the chassis in a fixturing jig.

After immobilization, a wire is fed through the backplate at operation 722b. The LGP, which is covered with a protective film, is then prepared for insertion at operation 722c by peeling the protective film from the LGP prior to insertion, thereby exposing the LGP. Afterwards, the LGP is integrated with the chassis by aligning the LGP with the locator pins in the chassis and placing the LGP in the chassis in the aligned position at operation 722d. After installation of the LGP, power (e.g., about 30 VDC at 250 mA) is applied to the FPC at operation 722e to illuminate the LEDs and the top of the LGP is visually inspected at operation 722f for defects evidenced by light being transmitted therethrough. If no defects are present, the protective film is removed from reflector at operation 722g and the reflector is installed on the top of the LGP in the chassis at operation 722g.

The backplate is then installed by placing the backplate on the assembly while pulling the slack wire though holes in the backplate. The assembled fixture containing the chassis, LGP, and reflector is then pressurized at operation 722j by covering the assembled fixture with a load plate, placing a weight on the load plate and locking the assembled fixture down with clasps. Once the structure is locked down, the structure is secured at operation 722k using fasteners such as self-tapping screws with a cross pattern. After securing the structure, the structure is released at operation 722l by removing the weight and unlocking the clasps. The structure is then lifted so that the fixture is exposed and a visual inspection undertaken from multiple predefined viewing angles at operation 722m to determine whether Moiré patterns are present.

In some embodiments, the observation at operation 722m is performed at about 1.5 m from the unit using a motion span viewing angle of about 0 to about 60° from the vertical direction (normal to the light emitting surface plane). In some cases, a fixed 60° viewing angle can be used if the correlation is high enough. Moiré defects are visible at these angles as multiple concentric brighter/darker alternating rings observable in the LGP light-emitting surface (LES), with LEDs ON or OFF. These ring defects are usually concentric, and can radiate from the LGP center or can also be off-center. They are caused by optical interference induced by the presence of a variable-width air gap(s) between reflector and LGP. If Moiré defects detected, the Moiré defects can be reworked by removing the gaps or replacing the parts (e.g., the reflector) inducing the gaps. The flatness and flat placement of the reflector over the LGP with minimized entrapment of an air layer or bubbles between reflector and LGP lens may substantially prevent the occurrence of Moiré defects. Thus, if a new reflector is determined to be used at operation 722p, the existing reflector is removed and a new reflector is selected at operation 722q and the process returns to operation 722g, where the reflector film is removed on the new reflector. On the other hand, if a new reflector is determined not to be used at operation 722p, the backplate is removed at operation 722r and the process returns to operation 722i, where the backplate is reinstalled.

Once the fixture passes the visual inspection, at operation 722o it is stored or moved to enable back-end processing at a third assembly process 730 as shown in FIG. 7G. The components added by the third assembly process 730 include a plug for the wiring, a label for the fixture and a protective film for the LGP. As the fixture may be fairly heavy and suspended by the wires that extend through the backplate, a strain relief grommet may be installed during the third assembly process 730 at operation 730a. A label may be attached to the backplate or another portion of the fixture at operation 730b to indicate the serial number of the fixture as well as other information related to the lighting provided by the fixture. The serial number may include numbers/letters and/or a QR code. In some embodiments, a simple NFC transmitter may be included. A protective film at operation 730c may be applied to the light exit surface of the LGP to protect the fixture during shipping.

The protected fixture may then be moved to an onboard assessment (OBA) station or a station for packaging as shown in FIG. 7H. The OBA station is in the cleanroom and is used for an OBA process 740. The OBA process 740 may include an OQA check at operation 740a and light-up of the fixture at operation 730b to ensure that the fixture is still operating within the desired parameters. That is, at operation 730b another visual inspection of the finished but unpackaged product, both lighted and unlighted, may be undertaken prior to packaging. The inspection may use, for example, a light meter to determine whether the light from the fixture has sufficient intensity (and, if capable, is able to be adjusted) and is uniform (e.g., no Moiré fringes). In some embodiments, the equipment for this station may include a display or projector disposed to focus on the LGP (and perhaps other portions of the fixture) to magnify the lighted image and allow easier visual inspection.

The packaging station is outside of the cleanroom and is used for a packaging process 750. In the packaging process, the fixture is inserted into a container, such as a bag, with a silica gel (5 g) packet. The container is closed, such as by taping the container shut or heat sealing the container. A cardboard carton shipping insert is assembled to protect the fixture, the fixture is placed into the insert, and the entire assembly is placed into the shipping carton. Another unit label is placed on the side of the carton to specify the contents, and a simplified paper label is placed on the side of the carton to identify the contents by type, color, and any number used by the manufacturer to identify the contents. The carton is then placed on a pallet and is ready to ship.

It will thus be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus, the following claims are hereby incorporated into the Detailed Description, with each claim standing on its own as a separate aspect.

What is claimed is:

1. A method of assembling a lighting system, the method comprising:
   determining whether a chassis has mechanical defects outside of a predetermined nominal range of defect;
   removing residue on the chassis in response to determining that the reflector has no mechanical defects outside of the predetermined nominal range of defect;
   installing a gasket in a groove of the chassis after determining whether the chassis has mechanical defects outside of the predetermined nominal range of defect;
   mounting light emitting diode (LED) strips on the chassis to form a first integrated chassis;
   inserting locator pins into the chassis between LEDs of the LED strips;
   aligning a light guide plate (LGP) with the locator pins in the chassis; and placing the LGP aligned in the chassis such that the LGP in the chassis is retained by the locator pins to limit thermal displacement of the LGP towards the LEDs.

2. The method of claim 1, further comprising:
integrating a reflector in the chassis containing the LGP to form a second integrated chassis, the reflector integrated in the second integrated chassis to cover the LGP substantially entirely and reflect light emitted by the LEDs into the LGP toward an exit surface of the LGP.

3. The method of claim 2, further comprising:
installing a strain relief mechanism to an outer portion of the second integrated chassis; and
applying a protective film to the exit surface of the LGP in the second integrated chassis.

4. The method of claim 1, further comprising:
in further response to determining that the reflector has no mechanical defects outside of the predetermined nominal range of defect, applying a protective film to an edge of the reflector prior to integrating the reflector in the chassis.

5. The method of claim 4, further comprising:
in further response to determining that the backplate has no mechanical defects outside of the predetermined nominal range of defect, sealing the first integrated chassis using the backplate and the gasket during formation of the second integrated chassis, the gasket contacting the exit surface of the LGP;
removing residue on the backplate to form a clean backplate; and
attaching a spacer to the clean backplate to separate the backplate and the reflector.

6. The method of claim 5, further comprising:
providing a white reflective sheet between the reflector and the backplate, the white reflective sheet having a diameter larger than that of the reflector.

7. The method of claim 5, further comprising:
inserting a reflective material between the reflector and the LED strips.

8. The method of claim 5, further comprising:
attaching a reflective tape between the reflector and the LED strips, over an edge of the reflector, and between the reflector and the backplate, the reflective tape attached to the LGP, the edge of the reflector, and a surface of the reflector opposing the backplate.

9. The method of claim 8, further comprising:
inserting a secondary reflective material on the reflective tape on the LGP and between the reflective tape and the LED strips.

10. The method of claim 1, further comprising:
determining whether the LGP is substantially free from Moiré fringes by performing at least one action selected from a set of actions comprising:
measuring light emitted from the LGP, and
capturing light emitted from the LGP and visually inspecting the LGP using the captured light.

11. The method of claim 1, further comprising mounting LED strips on the chassis by:
attaching a flexible printed circuit (FPC) containing the LED strips to an inner wall of a ridge that forms a cavity in the chassis;
bending a leg of the FPC over a top of the ridge to an outer wall on an opposite side of the ridge as the inner wall; and
making electrical contact with the FPC to drive the LEDs.

12. A method of assembling a lighting system, the method comprising:
integrating light emitting diode (LED) strips on a flexible printed circuit board (FPC) with a chassis to form a first integrated chassis;
inserting a light guide plate (LGP) into the first integrated chassis;
illuminating the LED strips to determine whether at least one of optical and mechanical defects are present in a first surface of the LGP;
determining whether optical and mechanical defects outside of a predetermined nominal range of defect are present in the first surface of the LGP;
based on a determination that neither optical nor mechanical defects outside of the predetermined nominal range of defects are determined to be present in the first surface of the LGP, installing a reflector on the first surface of the LGP to form a second integrated chassis, the reflector installed to reflect light emitted by the LEDs into the LGP toward a second surface of the LGP opposing the first surface of the LGP; and
determining whether Moiré fringes are present in the second surface of the LGP by varying a position of the second integrated chassis.

13. The method of claim 12, further comprising:
checking diameters of pin holes in the chassis;
inserting locator pins in the pin holes based on a determination that the pin holes are correctly sized for the locator pins; and
inserting the LGP into the first integrated chassis by aligning the LGP with the locator pins and inserting the aligned LGP into the first integrated chassis.

14. The method of claim 13, further comprising:
supplying power to the LED strips prior to integrating the FPC in the chassis to determine whether the LEDs on each LED strip illuminate;
in response to a determination that the LEDs illuminate, cleaning the FPC to be laminated on the chassis;
progressively peeling a pressure sensitive adhesive (PSA) release film on a back of the FPC;
aligning an end of the FPC with one of the pin holes to ensure that no locator pin, when inserted into the chassis, will block any of the LEDs; and
aligning a bottom edge of the FPC with a trench floor of the chassis such that the bottom edge is coincident with the trench floor the length of the FPC; and
applying pressure against flat surfaces of the FPC between the LEDs as the PSA release film is peeled off until an entirety of the FPC is mounted on the chassis, and thereafter inserting the locator pins in the pin holes.

15. The method of claim 14, further comprising:
connecting different color wires that supply power to the FPC to the LED strips by, for each color:
locating a wire having the color for connection into a first location of a connector on the FPC using a wire location template,
retaining an end of the wire having the color, inserting the end of the wire into the first location, and ensuring that the wire having the color is securely connected thereafter; and
routing the wires through a channel formed by a cavity in the chassis using tape to hold the wires in place.

16. The method of claim 15, further comprising:
removing residue on the chassis based on the determination that the chassis has no mechanical defects outside of the predetermined nominal range of defect; and
installing a gasket in a groove of the chassis.

17. The method of claim 16, further comprising:
rolling back protective film from a portion of an edge of the reflector after the determination that no mechanical defects are present in the reflector;
applying tape to the portion of the edge of the reflector that is uncovered by the protective film to form tape-covered edge; and
smoothing back the protective film on the tape-covered edge of the reflector and continuing to roll back the protective film, apply tape and smooth back the protective film until an entire edge of the reflector is tape-covered, the tape configured to provide spacing between the edge of the reflector and the chassis and between the reflector and the LGP.

18. The method of claim 17, wherein determining whether the reflector has mechanical defects outside of the predetermined nominal range of defect comprises at least one of visually inspecting and using laser line inspection to determine whether a surface of the reflector to oppose the first surface of the LGP has mechanical defects.

19. The method of claim 17, further comprising:
removing residue on the backplate to form a clean backplate based on the determination that the backplate has no mechanical defects outside of the predetermined nominal range of defect;
attaching a spacer to the clean backplate to form a spaced backplate; and
sealing the first integrated chassis using the spaced backplate and the gasket during formation of the second integrated chassis.

20. The method of claim 19, wherein sealing the first integrated chassis comprises:
placing the spaced backplate on the first integrated chassis containing the LGP and reflector to form an assembled fixture;
covering the assembled fixture with a load plate;
placing a weight on the load plate;
locking the assembled fixture down with clasps;
securing the assembled fixture using fasteners; and
releasing the assembled fixture by removing the weight and unlocking the clasps after securing the assembled fixture.

21. The method of claim 12, further comprising:
immobilizing the first integrated chassis by placing the chassis in a fixturing jig and thereafter inserting the LGP into the first integrated chassis.

22. The method of claim 12, wherein varying the position of the second integrated chassis to determine whether Moiré fringes are present in the second surface of the LGP comprises:
using a motion span viewing angle of about 0 to about 60° from the vertical direction normal to the second surface of the LGP.

23. The method of claim 12, further comprising:
in response to a determination that Moiré fringes are present in the second surface of the LGP, determining whether a new reflector is to be used;
in response to a determination that the new reflector is to be used, replacing the reflector with the new reflector; and
in response to a determination that the new reflector is not to be used, removing a backplate sealing the first integrated chassis, and reinstalling the backplate before re-determining whether Moiré fringes are present in the second surface of the LGP.

24. A method of assembling a lighting system, the method comprising:
inserting locator pins into pin holes in a bottom of a cavity in a chassis such that the locator pins are disposed between light emitting diodes (LEDs) in LED strips attached to a sidewall of the cavity;
aligning a light guide plate (LGP) with the locator pins and inserting the aligned LGP into the first integrated chassis and inserting the LGP into the chassis, the LGP retained by the locator pins; and
illuminating the LED strips to determine whether at least one of mechanical and optical defects outside of a predetermined nominal range of defect are present in a first surface of the LGP.

25. The method of claim 24, further comprising varying an angle of the integrated chassis from a constant viewpoint to determine whether Moiré fringes are present in the second surface of the LGP.

26. A method of assembling a lighting system, the method comprising:
mounting light emitting diode (LED) strips on a chassis to form a first integrated chassis;
inserting locator pins into the chassis between LEDs of the LED strips;
aligning a light guide plate (LGP) with the locator pins in the chassis;
placing the LGP aligned in the chassis such that the LGP in the chassis is retained by the locator pins to limit thermal displacement of the LGP towards the LEDs;
integrating a reflector in the chassis containing the LGP to form a second integrated chassis, the reflector integrated in the second integrated chassis to cover the LGP substantially entirely and reflect light emitted by the LEDs into the LGP toward an exit surface of the LGP;
installing a strain relief mechanism to an outer portion of the second integrated chassis; and
applying a protective film to the exit surface of the LGP in the second integrated chassis.

* * * * *